(12) United States Patent
Zheng et al.

(10) Patent No.: US 10,643,728 B2
(45) Date of Patent: May 5, 2020

(54) DISPLAY DRIVING CIRCUIT, DRIVING METHOD THEREOF, AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Liangliang Zheng, Beijing (CN); Tingting Jin, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/456,408

(22) Filed: Jun. 28, 2019

(65) Prior Publication Data

US 2019/0371421 A1 Dec. 5, 2019

Related U.S. Application Data

(63) Continuation-in-part of application No. 15/735,976, filed as application No. PCT/CN2017/080077 on Apr. 11, 2017, now Pat. No. 10,380,963.

(30) Foreign Application Priority Data

Apr. 25, 2016 (CN) .......................... 2016 1 0262856

(51) Int. Cl.
*G11C 19/28* (2006.01)
*G09G 3/00* (2006.01)

(52) U.S. Cl.
CPC ............. *G11C 19/28* (2013.01); *G09G 3/006* (2013.01); *G09G 2310/0286* (2013.01)

(58) Field of Classification Search
None
See application file for complete search history.

(56) References Cited

U.S. PATENT DOCUMENTS 7,995,012 B2    8/2011    Yanai et al.
8,237,641 B2    8/2012    Yanai et al.
(Continued)

FOREIGN PATENT DOCUMENTS

CN        1991949 A      7/2007
CN    101276528 A    10/2008
(Continued)

OTHER PUBLICATIONS

Search Report and Written Opinion for International Application No. PCT/CN2017/080077 dated Jun. 28, 2017.
(Continued)

*Primary Examiner* — Kenneth B Lee, Jr.
(74) *Attorney, Agent, or Firm* — Calfee, Halter & Griswold LLP

(57) ABSTRACT

A display driving circuit, including: a first input terminal configured to receive a first signal; a second input terminal configured to receive a second signal; a third input terminal configured to receive a third signal; an output terminal configured to output a gate driver control GIP signal; a voltage detection circuit configured to detect an anomaly of the first signal, the second signal, and the third signal, and produce a detection result to indicate the anomaly; a shift register signal output port configured to output the gate driver control GIP signal to the output terminal; and a control circuit configured to receive the detection result, wherein, when no anomaly is indicated by the detection result, the control circuit controls the shift register signal output port to output the gate driver control GIP signal, and when the anomaly of at least one of the first signal, the second signal or the third signal is indicated by the detection (Continued)

result, the control circuit controls the shift register signal output port to stop outputting.

17 Claims, 18 Drawing Sheets

(56) References Cited

U.S. PATENT DOCUMENTS

| | | | |
|---|---|---|---|
| 8,416,230 | B2 | 4/2013 | Goder |
| 8,441,420 | B2 | 5/2013 | Kim et al. |
| 8,698,720 | B2 * | 4/2014 | Kaneda ................ G09G 3/3696 345/87 |
| 9,152,197 | B2 | 10/2015 | Liu |
| 9,292,853 | B2 | 3/2016 | Ascarrunz et al. |
| 9,298,288 | B2 * | 3/2016 | Park ........................ G06F 3/038 |
| 2006/0061525 | A1 | 3/2006 | Kim et al. |
| 2007/0146254 | A1 | 6/2007 | Yanai et al. |
| 2010/0141633 | A1 | 6/2010 | Goder |
| 2011/0285305 | A1 | 11/2011 | Yanai et al. |
| 2012/0175953 | A1 | 7/2012 | Ohkawa et al. |
| 2013/0221339 | A1 | 8/2013 | Kim et al. |
| 2015/0026486 | A1 | 1/2015 | Liu |
| 2015/0339975 | A1 | 11/2015 | Liu |
| 2016/0111042 | A1 | 4/2016 | Pyeon |

FOREIGN PATENT DOCUMENTS

| | | |
|---|---|---|
| CN | 101383129 A | 3/2009 |
| CN | 104093257 A | 10/2014 |
| CN | 104167181 A | 11/2014 |
| CN | 104331141 A | 2/2015 |
| CN | 105304050 A | 2/2016 |
| CN | 105679230 A | 6/2016 |
| CN | 106486041 A | 3/2017 |
| CN | 106531071 A | 3/2017 |
| CN | 106531080 A | 3/2017 |
| CN | 206301579 U | 7/2017 |
| CN | 206301580 U | 7/2017 |
| WO | 201077687 A1 | 7/2010 |

OTHER PUBLICATIONS

First Office Action for Chinese Patent Application No. 20160262856.5 dated Dec. 21, 2017.
First Office Action for Chinese Patent Application No. 201611247392.7 dated Sep. 28, 2017.
Search Report and Written Opinion for International Application No. PCT/CN2017/089214 dated Sep. 4, 2017.

* cited by examiner

DISPLAY DRIVING CIRCUIT, DRIVING METHOD THEREOF, AND DISPLAY DEVICE

CROSS-REFERENCE OF RELATED APPLICATION

The present invention is a CIP (continuation-in-part) application of U.S. application Ser. No. 15/735,976, filed on Dec. 13, 2017, which is based upon International Application No. PCT/CN2017/080077, filed on Apr. 11, 2017, which claims the benefits of Chinese patent application No. 201610262856.5 titled "DISPLAY DRIVING CIRCUIT, DRIVING METHOD THEREOF, AND DISPLAY DEVICE", which was filed with the SIPO on Apr. 25, 2016, the entire contents of each of which are fully incorporated herein by reference as part of this application.

TECHNICAL FIELD

The present disclosure relates to a display driving circuit, a driving method thereof, and a display device.

BACKGROUND

In recent years, with the flourishing development of semiconductor technology, portable electronic products as well as flat panel display products have also been raised. A flat panel display usually is consisted of pixel matrixes arranged in both vertical direction and horizontal direction. When performing a display function, the flat panel display generates gate input signals through a shift register and scans each row of pixels in an order from a first row to a last row. In designing the flat panel display, it needs to design an appropriate shift register to ensure stable operation thereof. Usually, the shift register is comprised of multiple stages of shift register units which are coupled in series, and an output signal of a previous stage of shift register unit is used as an input signal of a subsequent stage of shift register unit.

SUMMARY

In view of this, exemplary embodiments provide a display driving circuit, a driving method thereof, and a display device which are intended to solve the problems in existing display driving chips that: a gate driver control signal mismatched with a voltage required by a GOA in a display panel may be output and cause product anomaly.

An exemplary embodiment provides a display driving circuit, including: a first input terminal, configured to receive a first signal; a second input terminal, configured to receive a second signal; a third input terminal, configured to receive a third signal; an output terminal, configured to output a gate driver control GIP signal; a voltage detection circuit, configured to detect an anomaly of the first signal, the second signal and the third signal, and produce a detection result to indicate the anomaly; a shift register signal output port, configured to output the gate driver control GIP signal to the output terminal; and a control circuit, configured to receive the detection result, wherein, when no anomaly is indicated by the detection result, the control circuit controls the shift register signal output port to output the gate driver control GIP signal, and when the anomaly of at least one of the first signal, the second signal or the third signal is indicated by the detection result, the control circuit controls the shift register signal output port to stop outputting.

Another exemplary embodiment provides display a driving circuit, including: a first input terminal, configured to receive a first signal; a second input terminal, configured to receive a second signal; a third input terminal, configured to receive a third signal; an output terminal, configured to output a gate driver control GIP signal; a voltage detection circuit, configured to detect an anomaly of the first signal, the second signal, the third signal, and a high-voltage reference voltage signal VGH and a low-voltage reference voltage signal VGL in the display driving circuit, and produce a detection result to indicate the anomaly; a shift register signal output port, configured to output the gate driver control GIP signal to the output terminal; and a control circuit, configured to receive the detection result, wherein, when no anomaly is indicated by the detection result, the control circuit controls the shift register signal output port to output the gate driver control GIP signal, and when the anomaly of at least one of the first signal, the second signal, the third signal, and the high-voltage reference voltage signal VGH or the low-voltage reference voltage signal VGL in the display driving circuit is indicated by the detection result, the control circuit controls the shift register signal output port to stop outputting.

Another exemplary embodiment provides a display device, including: a display panel integrated with a shift register, and the display driving circuit according to the first aspect of the present disclosure.

Another exemplary embodiment provides a display device, including: a display panel integrated with a shift register, and the display driving circuit according to the second aspect of the present disclosure.

Another exemplary embodiment provides a driving method of the display driving circuit according to the second aspect of the present disclosure, including: receiving, by a first input terminal, a first signal; receiving, by a second input terminal, a second signal; receiving, by a third input terminal, a third signal; detecting, by a voltage detection circuit, an anomaly of the first signal, the second signal, the third signal, and a high-voltage reference voltage signal VGH and a low-voltage reference voltage signal VGL in the display driving circuit, and producing a detection result to indicate the anomaly; receiving, by a control circuit, the detection result, and determining, when no anomaly is indicated by the detection result, to control an shift register signal output port to output the gate driver control GIP signal, and when the anomaly of at least one of the first signal, the second signal, the third signal, and the high-voltage reference voltage signal VGH or the low-voltage reference voltage signal VGL in the display driving circuit is indicated by the detection result, to control the shift register signal output port to stop outputting.

BRIEF DESCRIPTION OF THE DRAWINGS

The drawings herein are incorporated in and constitute a part of the specification, showing exemplary embodiments consistent with the present disclosure and, together with the description, serve to explain the principles of the present disclosure and without limiting the present disclosure in any way. In the drawings.

DETAILED DESCRIPTION

Hereinafter, specific implementations of the display driving circuit, the driving method thereof and the display device provided by the exemplary embodiments will be described in more details with reference to the drawings. The following exemplary embodiments are provided to describe the technical solution of the present disclosure more clearly, and should not be construed as any limitation to the scope of the present disclosure.

Figure 1:
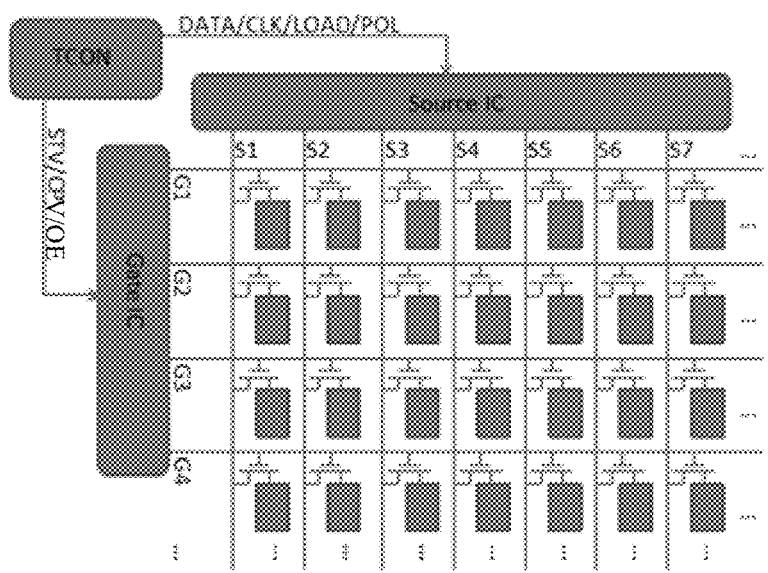
FIG. 1 is a structural schematic diagram of a flat panel display in the prior art.

As illustrated in FIG. 1, a shift register may be disposed in a gate driver chip (Gate IC); after the system transmits image information to a timer controller (TCON), the TCON outputs a STV/CPV/OE signal to the Gate IC to control the Gate IC; the Gate IC controls gate lines G1, G2, G3, G4 . . . in the display panel to be turned on row by row according to the above-mentioned signal; the TCON outputs a DATA/CLK/LOAD/POL signal to a source driver chip (Source IC), and the Source IC inputs a respective data signal to each data line of data lines S1, S2, S3, S4, S5, S6, S7 . . . in the display panel according to the above-mentioned signal.

Figure 2:
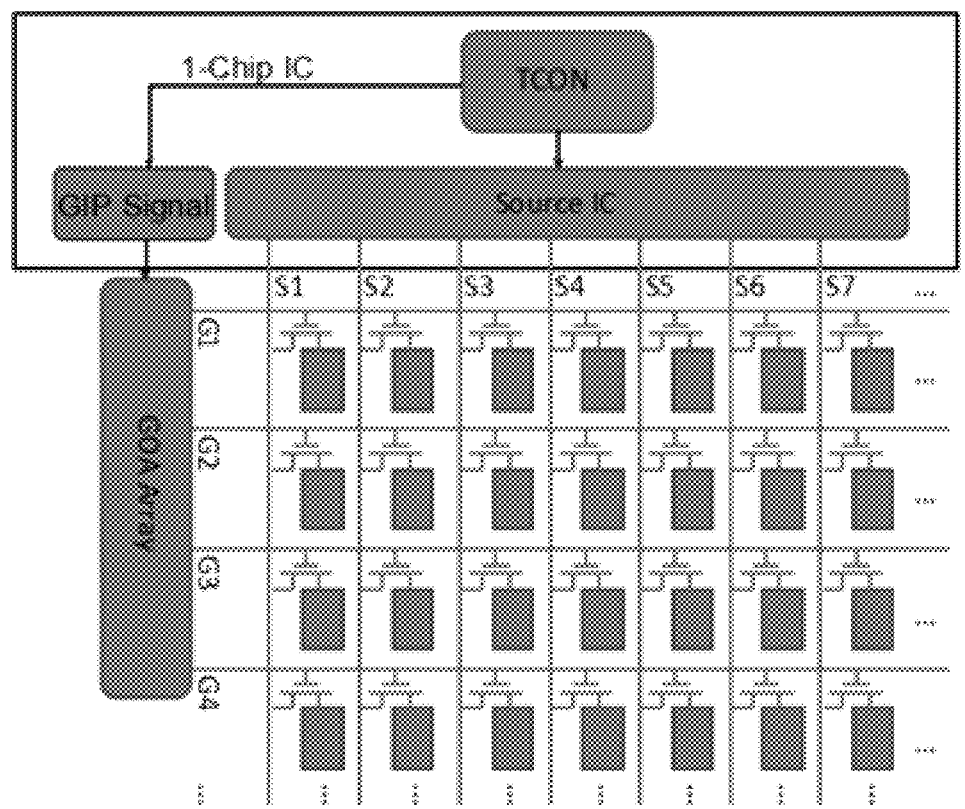
FIG. 2 is another structural schematic diagram of the flat panel display in the prior art.

Currently, in order to reduce manufacturing costs of flat panel displays, manufactures in the industry directly fabricate a multi-stage amorphous silicon shift register on a substrate of the display panel to replace the above-mentioned Gate IC, so as to achieve the objective of reducing the manufacturing cost of the display panel. As illustrated in FIG. 2, when the shift register is integrated in the display panel (GOA Array), the gate driver, the TCON and the source IC may be integrated in a single chip (1-Chip IC) which may be referred to as a display driver chip. The 1-Chip IC is further configured to provide a gate driver control signal (GIP Signal) to the GOA Array, as well as inputting a respective data signal to each data line of the data lines S1 . . . S7 in the display panel.

Due to the fact that GOA models in the display panels designed by various panel manufactures may be more or less different, requirements for the voltage of the GIP Signals may be different from each other, and therefore the problem of the GIP Signal output by the 1-Chip IC mismatching with the voltage required by the GOA in the display panel may occur, which may cause abnormal products obtained upon assembling the 1-Chip IC with the display panel, and may involve quality risks if such products flow to external client terminals.

The display driving circuit, the driving method thereof and the display device provided by several exemplary embodiments additionally incorporates three external voltage detections circuit besides a voltage detection circuit into an existing display driving circuit and provide a control switch between the first input terminal of the level conversion circuit and the output terminal of the power supply management circuit, such that it can detect and prevent anomaly more thoroughly and accurately, therefore upon determining that the signal is abnormal, it can bring the display panel in a normally white mode or a normally black mode, which avoids a possible scenario that a gate driver control signal mismatched with a voltage required by a shift register of the display panel is input into the shift register, and hence prevents assembled display products from involving any anomaly due to the mismatch of the output signal of the display driving circuit and the display panel.

Figure 3:
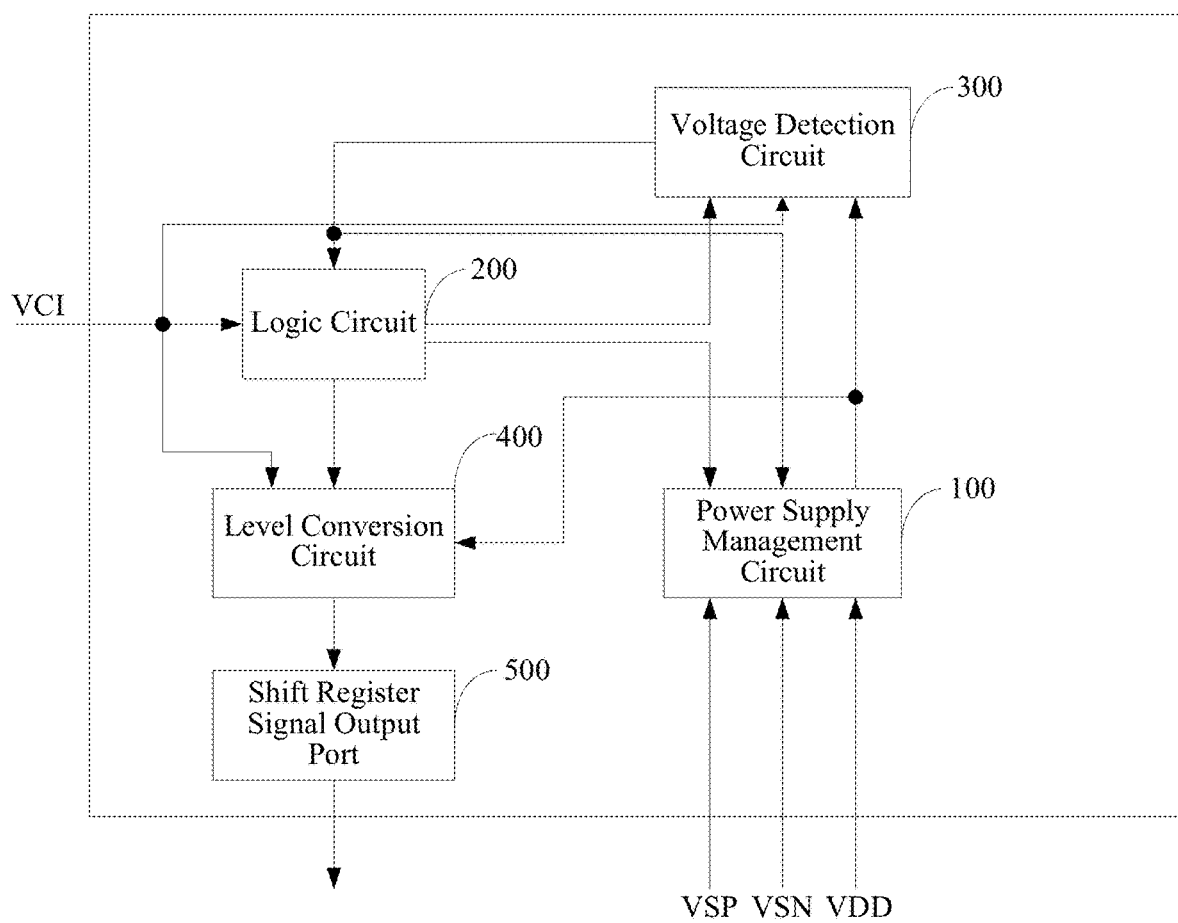
FIG. 3 is a structural schematic diagram of a display driving circuit provided by some exemplary embodiments.

Some exemplary embodiments provide a display driving circuit. As illustrated in FIG. 3, the display driving circuit includes: a power supply management circuit 100, a logic circuit 200 and a voltage detection circuit 300. A first output terminal of the logic circuit 200 is coupled to a first input terminal of the power supply management circuit 100, and a second output terminal of the logic circuit 200 is coupled to a first input terminal of the voltage detection circuit 300; an output terminal of the power supply management circuit 100 is coupled to a second input terminal of the voltage detection circuit 300; and an output terminal of the voltage detection circuit 300 is coupled to a second input terminal of the power supply management circuit 100.

The logic circuit 200 is configured to output a standard reference voltage signal to the voltage detection circuit 300, and output a control signal to the power supply management circuit 100; the control signal is configured to control the power supply management circuit 100 to output a reference voltage signal.

The voltage detection circuit 300 is configured to control the power supply management circuit 100 to stop outputting the reference voltage signal, upon determining the received reference voltage signal output by the power supply management circuit 100 is abnormal according to the standard reference voltage signal output by the logic circuit 200.

The above-mentioned display driving circuit provided by some exemplary embodiments additionally incorporates a voltage detection circuit 300 into an existing display driving circuit. The voltage detection circuit 300 can determine whether a reference voltage signal output by a power supply management circuit 100 is abnormal or not according to a standard reference voltage signal output by a logic circuit 200, and can control the power supply management circuit 100 to stop outputting the reference voltage signal upon determining the reference voltage signal is abnormal, so as to bring the power supply management circuit 100 into a standby mode where the display panel is in a normally white mode or a normally black mode, which avoids a possible scenario that a gate driver control signal mismatched with a voltage required by a shift register of the display panel is input into the shift register, and hence prevents assembled display products from involving any anomaly due to the mismatch of the output signal of the display driving circuit and the display panel.

In practical implementations, as illustrated in FIG. 3, the above-mentioned display driving circuit provided by some exemplary embodiments usually further includes a level conversion circuit 400; a first input terminal of the level conversion circuit 400 is coupled to the output terminal of the power supply management circuit 100, a second input terminal of the level conversion circuit 400 is coupled to a third output terminal of the logic circuit 200, and an output terminal of the level conversion circuit 400 is coupled to a shift register signal output port 500. The level conversion circuit 400 is configured to generate a gate driver control signal (GIP signal) according to a high-voltage power supply signal from the logic circuit 200 and the reference voltage signal from the power supply management circuit 100, and then output the GIP signal to a GOA circuit on the display panel so as to provide a control signal to the GOA circuit.

In practical implementations, in the above-mentioned display driving circuit provided by some exemplary embodiments, the power supply management circuit 100 may receive various power supply signals from system chips, such as power supply VDD signal, +5V power supply VSP signal, and −5V power supply VSN signal as illustrated in FIG. 3; and then generate all logic voltage signals required by an interior of the display driving circuit according to the control signal sent from the logic circuit 200, for example, a reference voltage signal that may be generated and sent to the level conversion circuit 400. Furthermore, as illustrated in FIG. 3, in the display driving circuit, other circuits (including the logic circuit 200, the voltage detection circuit 300 and the level conversion circuit 400) except for the power supply management circuit 100, may further receive a low-voltage power supply VCI signal which is input from outside of the display driving circuit, and the VCI signal is configured to provide a power supply signal to the circuits coupled thereto. In more details, the reference voltage signal usually includes a low-voltage reference voltage signal VGL and a high-voltage reference voltage signal VGH.

In practical implementations, the standard reference voltage signal mentioned in the exemplary embodiments may be a low-voltage reference voltage generated from a low-voltage power supply VCI signal, e.g., a reference voltage of 0.9V, 1.0V, 1.1V and the like, and details of the circuits generating the reference voltage may refer to contents disclosed in existing technologies without particularly repeating herein. However, the above values are illustrative only, and embodiments are not intended to be limited thereto.

In practical implementations, in the above-mentioned display driving circuit provided by some exemplary embodiments, as illustrated in FIG. 3, in addition to the reference voltage signal sent from the power supply management circuit 100, the level conversion circuit 400 may further receive a high-voltage power supply signal sent from the logic circuit 200. As a result, when the voltage detection circuit 300 determines that the reference voltage signal generated by the power supply management circuit 100 is abnormal, in order to ensure that the level conversion circuit 400 will not generate the GIP signal and send the same to the shift register signal output port 500, the voltage detection circuit 300 may be further configured to control the logic circuit 200 to stop outputting the control signal upon determining that the received reference voltage signal output by the power supply management circuit 100 is abnormal according to the standard reference voltage signal output by the logic circuit 200, so as to bring the logic circuit 200 into a standby mode where the logic circuit 200 will not output a high-voltage power supply signal either. In such case, on one hand, the power supply management circuit 100 will not receive the control signal from the logic circuit 200 and hence will not output the reference voltage signal to the level conversion circuit 400. On the other hand, the level conversion circuit 400 will not receive the high-voltage power supply signal from the logic circuit 200 and hence will not generate the GIP signal either.

Figure 4:
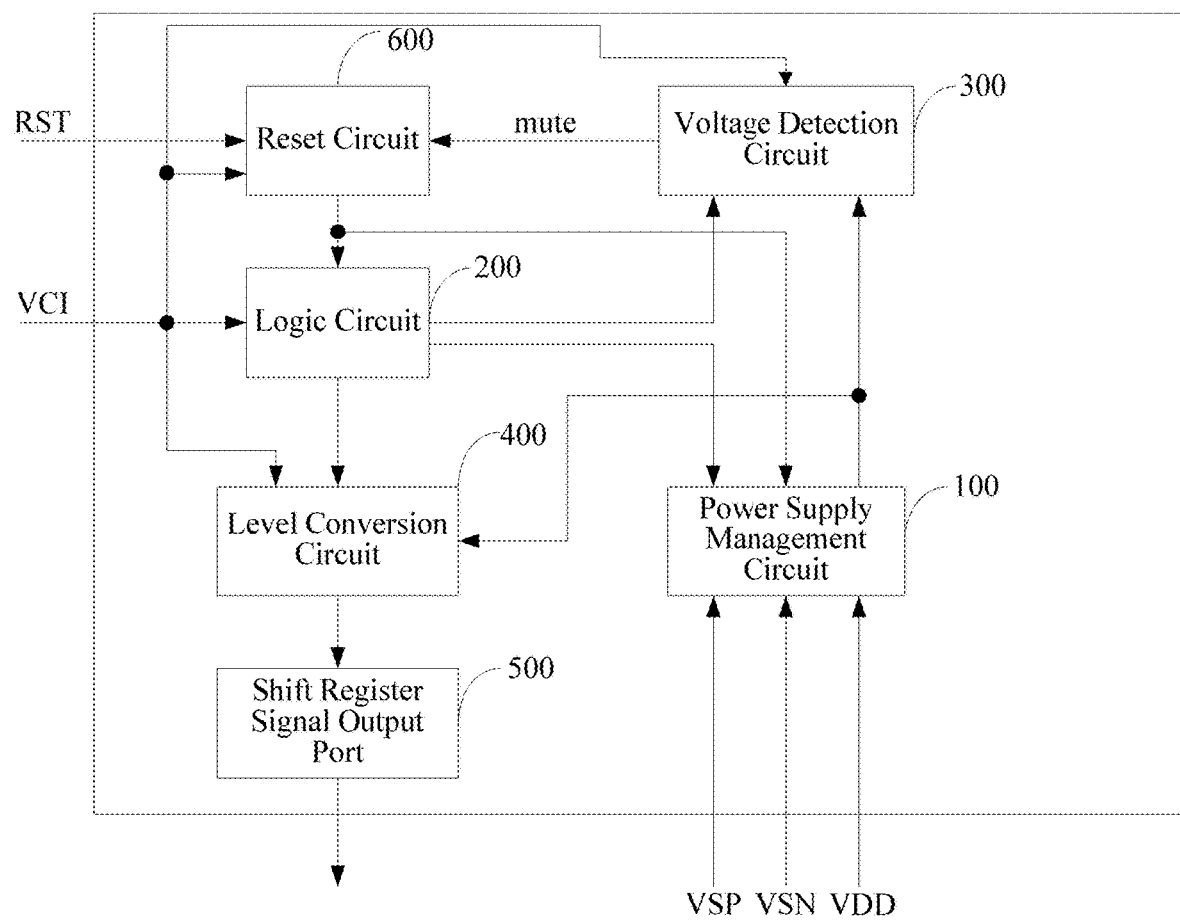
FIG. 4 is another structural schematic diagram of the display driving circuit provided by some exemplary embodiments.

In addition, as illustrated in FIG. 4, the above-mentioned display driving circuit provided by some exemplary embodiments may further include a reset circuit 600; and an output terminal of the voltage detection circuit 300 is coupled to the second input terminal of the power supply management circuit 100 and the first input terminal of the logic circuit 200, respectively, through the reset circuit 600. In practical implementations, the voltage detection circuit 300 added to the display driving circuit is configured to control the power supply management circuit 100 and the logic circuit 200 to be in a standby state, respectively, through the reset circuit, upon detecting an anomaly in the reference voltage signal. In more details, the voltage detection circuit 300 is configured to send a warning (mute) signal to the reset circuit 600 upon determining the received reference voltage signal output by the power supply management circuit 100 is abnormal according to the standard reference voltage signal output by the logic circuit 200. The reset circuit 600 is further configured to send a standby signal to the power supply management circuit 100 and the logic circuit 200, respectively, to control the power supply management circuit 100 and the logic circuit 200 to be in a standby state, upon receiving the mute signal. The power supply management circuit 100 and the logic circuit 200 will be in a standby state upon receiving the standby signal, and will not output any signal.

The above-mentioned logic circuit 200 provided by some exemplary embodiments may be a circuit with two input terminals, wherein a first input terminal of the logic circuit 200 may be defined as the one receiving the output of the reset circuit 600 for the logic circuit 200, and a second input terminal of the logic circuit 200 may be the one coupled to a low-voltage power supply VCI signal. However, the present disclosure is not intended to be limited thereto.

In addition, in the above-mentioned display driving circuit provided by some exemplary embodiments, as illustrated in FIG. 4, the reset circuit 600 may further receive a reset (RST) signal input from outside of the display driving circuit, and the RST signal may also trigger the reset circuit 600 to send the standby signal.

In addition, as illustrated in FIG. 4, the reset circuit may be further coupled to a VCI signal, and the VCI signal may also provide a power supply signal to the reset circuit.

Figure 5:
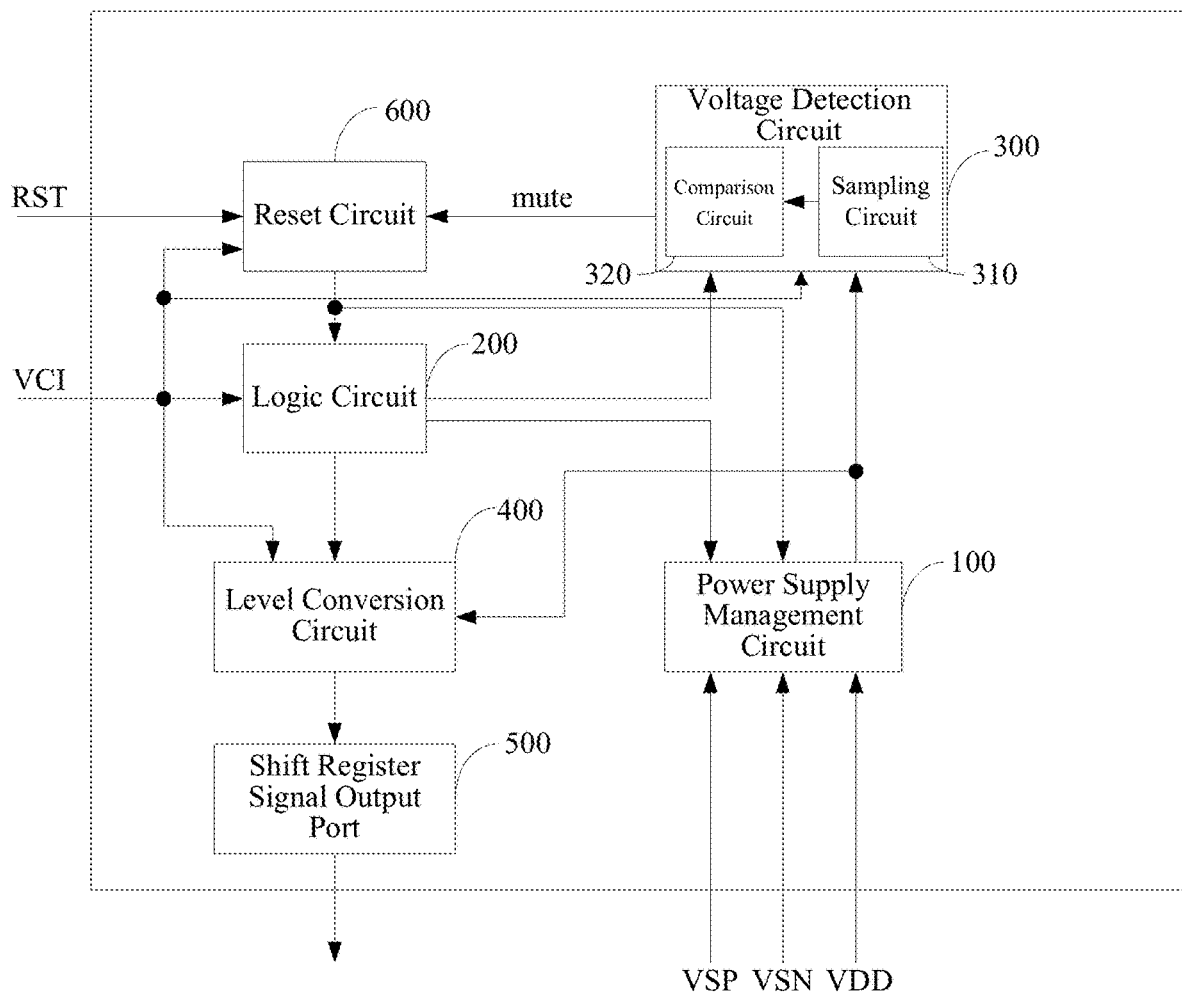
FIG. 5 is yet another structural schematic diagram of the display driving circuit provided by some exemplary embodiments.

In the above-mentioned display driving circuit provided by some exemplary embodiments, when the output terminal of the voltage detection circuit 300 is coupled to the second input terminal of the power supply management circuit 100 and the first input terminal of the logic circuit 200, respectively, through the reset circuit 600, as illustrated in FIG. 5, the voltage detection circuit 300 may include a sampling circuit 310 coupled to the output terminal of the power supply management circuit 100 and a comparison circuit 320 coupled to the second output terminal of the logic circuit 200. The sampling circuit 310 is configured to convert the reference voltage signal into a digital signal and output the digital signal to the comparison circuit 320, upon receiving the reference voltage signal. The comparison circuit 320 is configured to compare the digital signal with the standard reference voltage signal as received, and send a mute signal to the reset circuit 600 upon determining that a difference between the digital signal and the standard reference voltage signal is not within a threshold range.

In an exemplary embodiment, the sampling circuit 310 samples a high-voltage reference voltage output by the power supply management circuit 100. The sampling circuit 310 contains a voltage-divider network which converts the high-voltage reference signal into a low-voltage signal. By way of example, if the standard reference voltage signal output by the logic circuit 200 is 1V and if the high-voltage reference voltage output by the power supply management circuit 100 according to design requirements has to be equal to or higher than 12V, i.e., if the high-voltage reference voltage is higher than 12V, then the voltage-divider network in the interior of the sampling circuit 310 outputs a low-voltage reference voltage higher than 1V, the voltage detection circuit 300 outputs a low level, the reset circuit 600 will not be turned on, and hence the system will be in normal operation; otherwise, the voltage detection circuit 300 outputs a high level, the reset circuit 600 will be turned on, and hence the system will be shut down.

In addition, in the above-mentioned display driving circuit provided by some exemplary embodiments, the comparison circuit 320 may be further configured to send a normal signal different from the warning signal to the reset circuit 600 or not to send any signal at all, upon determining that the difference between the digital signal and the standard reference voltage signal is within the threshold range. Generally, the warning signal is a high-level signal, and the normal signal is a low-level signal. Upon receiving the low-level signal, the reset circuit 600 will not be turned on; at this point, the power supply management circuit 100 and the logic circuit 200 both will be in normal operation, and the level conversion circuit 400 will normally send the GIP signal. Upon receiving the high level signal, the reset circuit 600 sends a standby signal to the power supply management circuit 100 and the logic circuit 200, respectively, so that the two circuits both will be in a standby mode, the level conversion circuit 400 will not output any signal, then the shift register of the display panel will be input with no signal, and hence the display panel will be in a normally white mode or a normally black mode. It should be explained that, the warning signal and the normal signal may be signals of other types, as long as they can control the reset signal to or not to normally operate.

Figure 6:
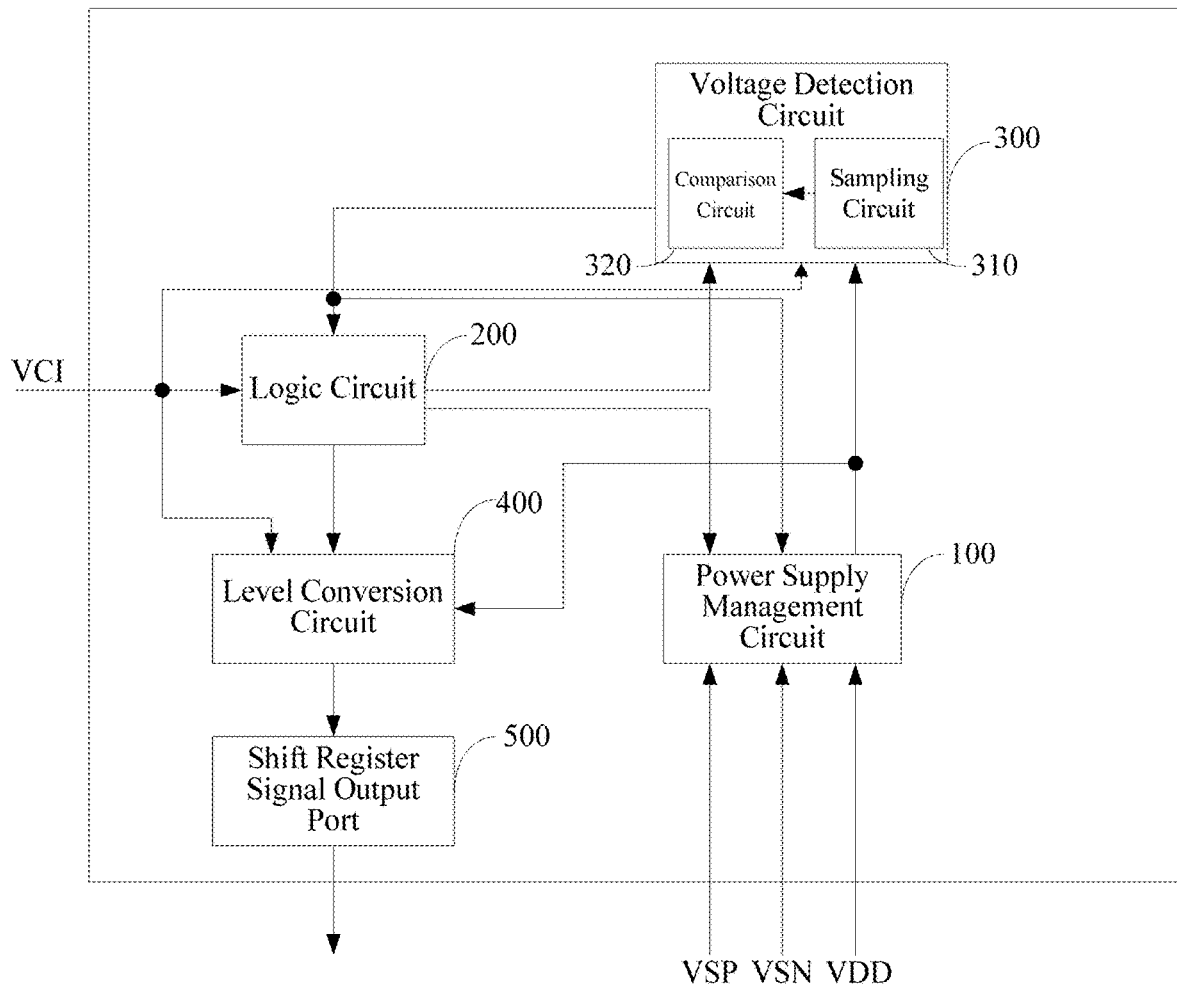
FIG. 6 is still another structural schematic diagram of the display driving circuit provided by some exemplary embodiments.

In an exemplary embodiment, when the output terminal of the voltage detection circuit 300 is directly coupled to the second input terminal of the power supply management circuit 100 and the first input terminal of the logic circuit 200, respectively, as illustrated in FIG. 6, the voltage detection circuit 300 may include a sampling circuit 310 coupled to the output terminal of the power supply management circuit 100 and a comparison circuit 320 coupled to the logic circuit 200. The sampling circuit 310 is configured to convert the reference voltage signal into a digital signal and send the digital signal to the comparison circuit 320, upon receiving the reference voltage signal. The comparison circuit 320 is configured to compare the digital signal with the standard reference voltage signal as received, and send a standby signal to the power supply management circuit 100 and the logic circuit 200, respectively, to control the power supply management circuit 100 and the logic circuit 200 to be in a standby mode, respectively, upon determining that the difference between the digital signal and the standard reference voltage signal is not within a threshold range.

In addition, in the above-mentioned display driving circuit provided by some exemplary embodiments, the comparison circuit 320 may be further configured to send a normal signal to the power supply management circuit 100 and the logic circuit 200, respectively, to control the power supply management circuit 100 and the logic circuit 200 to be in an operation state, respectively, or not to send any signal at all, upon determining that the difference between the digital signal and the standard reference voltage signal is within the threshold range. Generally, the standby signal is a high-level signal, and the normal signal is a low-level signal. When the comparison circuit outputs a normal signal or outputs no signal at all, the power supply management circuit 100 and the logic circuit 200 both can maintain the normal operation state. Upon receiving the normal signal, the power supply management circuit 100 and the logic circuit 200 will be in normal operation, and the level conversion circuit 400 will normally send the GIP signal. Upon receiving the standby signal, the power supply management circuit 100 and the logic circuit 200 both will be in a standby mode without outputting any signal, the level conversion circuit 400 will output no signal, then the shift register of the display panel will be input with no signal, and hence the display panel will be in a normally white mode or a normally black mode. It should be explained that, the above-mentioned standby signal and the normal signal may be signals of other types, as long as they can control the power supply management circuit and the logic circuit to or not to normally operate.

Figure 7:
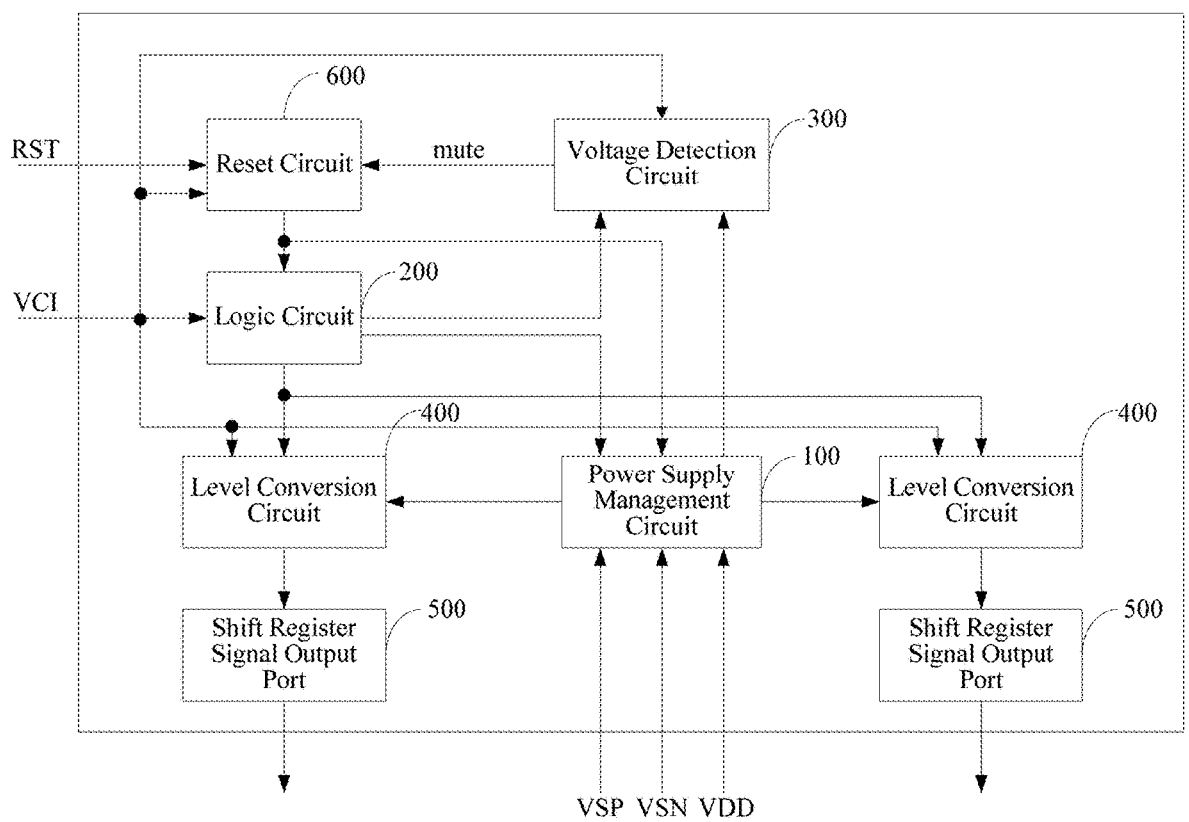
FIG. 7 is further another structural schematic diagram of the display driving circuit provided by some exemplary embodiments.

In practical implementations, an amount of the level conversion circuit 400 and the shift register signal output port 500 coupled thereto in the above-mentioned display driving circuit provided by some exemplary embodiments may be configured according to the type of the shift register disposed in the display panel. For more details, in order to be adapted to a display panel driven by an unidirectional shift register, as illustrated in FIG. 3 and FIG. 4, the display driving circuit may be configured with a set of level conversion circuits 400 and shift register signal output ports 500; in order to be adapted to a display panel driven by a bidirectional shift register, as illustrated in FIG. 7, the display driving circuit may be configured with two sets of level conversion circuits 400 and shift register signal output ports 500.

Based on the same inventive concept, exemplary embodiments further provide a display device including the above-mentioned display driving circuit provided by the exemplary embodiment as well as a display panel integrated with a shift register. The display device may be any product or component having display function such as mobile phone, tablet computer, television set, displayer, notebook computer, digital photo frame and navigator. As for the implementation of the display device, reference may be made to the foregoing exemplary embodiments of the display driving circuit, without particularly repeating herein.

In addition, in the above-mentioned display device provided by exemplary embodiments, the display panel may be a liquid crystal display panel, or may be an electroluminesccence display panel, or may be display panels which adopt other light-emitting manners and utilize the shift register integrated on the display panel to generate the gate scan signal, without particularly defined herein.

Exemplary embodiments of the present disclosure further provides a driving method of the above-mentioned display driving circuit, including: the logic circuit outputs a standard reference voltage signal to the voltage detection circuit; the power supply management circuit outputs a reference voltage signal to the voltage detection circuit; the voltage detection circuit determines whether the reference voltage signal as received is abnormal according to the standard reference voltage signal as received; if the reference voltage signal is abnormal, then the voltage detection circuit controls the power supply management circuit to stop outputting the reference voltage signal, and if the reference voltage signal is normal, then the power supply management circuit operates normally.

In addition, the above-mentioned driving method further includes: if the reference voltage signal is abnormal, then the voltage detection circuit further controls the logic circuit to stop outputting the control signal.

Exemplary embodiments provide a display driving circuit, a driving method thereof and a display device which additionally incorporate a voltage detection circuit into an existing display driving circuit; the voltage detection circuit can determine whether a reference voltage signal output by a power supply management circuit is abnormal or not according to a standard reference voltage signal output by a logic circuit, and can control the power supply management circuit to stop outputting the reference voltage signal upon determining the reference voltage signal is abnormal, so as to bring the power supply management circuit into a standby mode where the display panel is in a normally white mode or a normally black mode, which avoids a possible scenario that a gate driver control signal mismatched with a voltage required by a shift register of the display panel is input into the shift register, and hence prevents assembled display products from involving any anomaly due to the mismatch of the output signal of the display driving circuit and the display panel.

Figure 8:
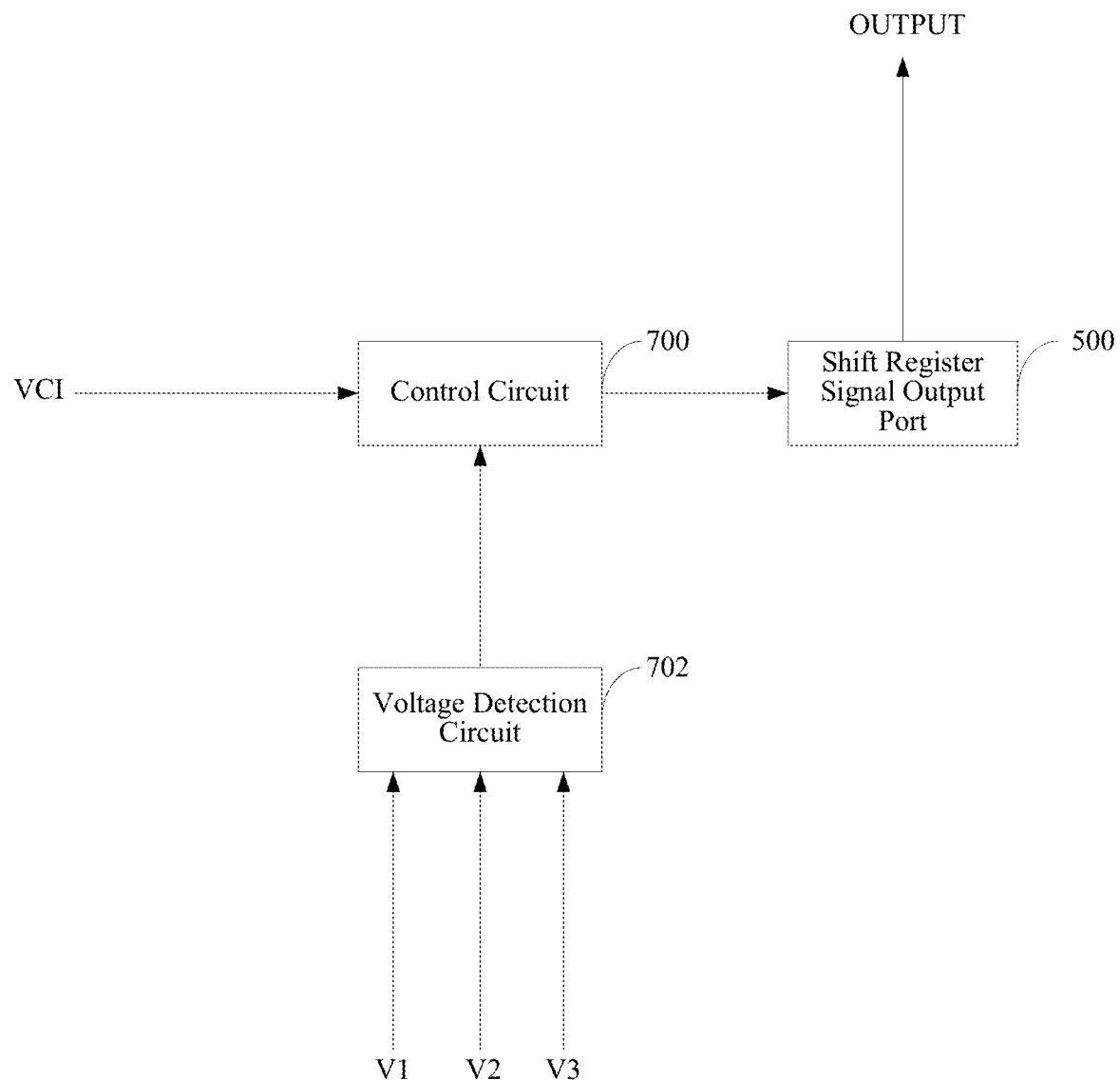
FIG. 8 is a structural schematic diagram of a display driving circuit provided by some exemplary embodiments.

FIG. 8 is a structural schematic diagram of a display driving circuit provided by some exemplary embodiments. As shown in FIG. 8, the display driving circuit 1000 includes a first input terminal, a second input terminal, a third input terminal, an output terminal OUTPUT, a voltage detection circuit 702, a shift register signal output port 500 and a control circuit 700.

The first input terminal is configured to receive a first signal V1, the second input terminal is configured to receive a second signal V2, and the third input terminal is configured to receive a third signal V3. The signals V1, V2 and V3 generally are voltage signals. The output terminal OUTPUT is configured to output a gate driver control GIP signal, so as to drive the above mentioned GOA circuit. The shift register signal output port 500 is configured to output the gate driver control GIP signal to the output terminal, which is the same as mentioned in the above exemplary embodiments.

The voltage detection circuit 702 is configured to detect an anomaly of the first signal, the second signal and the third signal, and produce a detection result to indicate the anomaly. Here the item anomaly has the same meaning as the above mentioned, that is, in existing display driving chips that: a gate driver control signal mismatched with a voltage required by a GOA in a display panel may be output and cause product anomaly, or any anomaly due to the mismatch of the output signal of the display driving circuit and the display panel.

The control circuit 700 is configured to receive the detection result, wherein, when no anomaly is indicated by the detection result, the control circuit 700 controls the shift register signal output port 500 to output the gate driver control GIP signal, and when the anomaly of at least one of the first signal V1, the second signal V2 or the third signal V3 is indicated by the detection result, the control circuit 700 controls the shift register signal output port 500 to stop outputting the gate driver control GIP signal.

Figure 9:
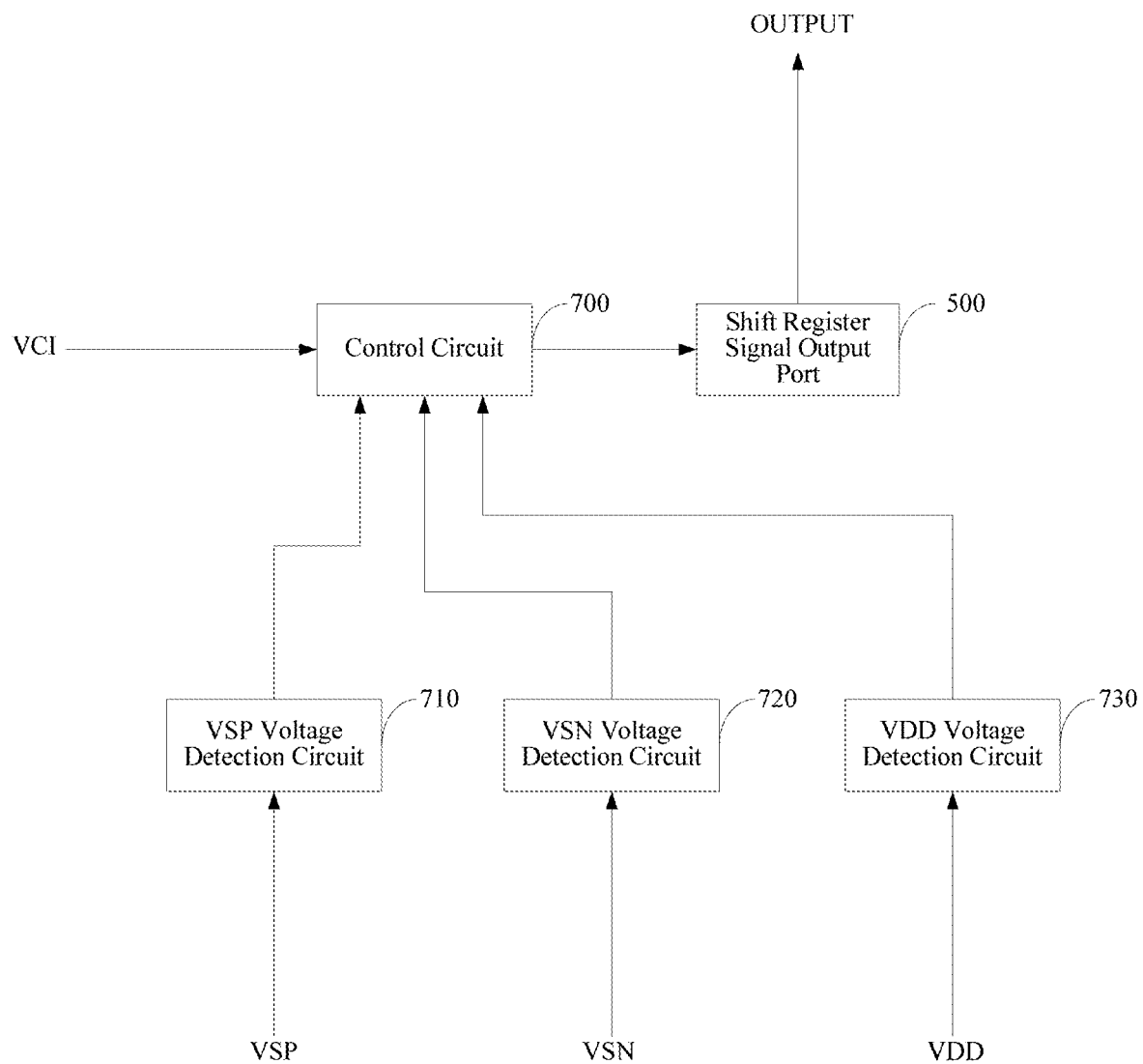
FIG. 9 is another structural schematic diagram of the display driving circuit provided by some exemplary embodiments.

FIG. 9 is another structural schematic diagram of the display driving circuit provided by some exemplary embodiments. As shown in FIG. 9, in the display driving circuit 1010, the first signal V1, the second signal V2 and the third signal V3 may be respectively a positive power supply VSP signal, a negative power supply VSN signal and a unipolar power supply VDD signal as the above mentioned. Here, the voltage detection circuit 702 may further include a VSP voltage detection circuit 710, configured to detect an anomaly of the positive power supply VSP signal, and produce a VSP detection result to indicate the anomaly; a VSN voltage detection circuit 720, configured to detect an anomaly of the negative power supply VSN signal, and produce a VSN detection result to indicate the anomaly; and a VDD voltage detection circuit 730, configured to detect an anomaly of the unipolar power supply VDD signal, and produce a VDD detection result to indicate the anomaly.

Here, the control circuit 700 is configured to receive the VSP detection result, the VSN detection result and the VDD detection result, and when no anomaly is indicated by the VSP detection result, the VSN detection result and the VDD detection result, the control circuit 700 controls the shift register signal output port 500 to output the gate driver control GIP signal, and when the anomaly is indicated by at least one of the VSP detection result, the VSN detection result or the VDD detection result, the control circuit 700 controls the shift register signal output port 500 to stop outputting the gate driver control GIP signal.

As another exemplary embodiment, all of the circuits of the display driving circuits of the disclosure, including the voltage detection circuit 702 and the control circuit 700 are integrated in one chip.

Figure 10:
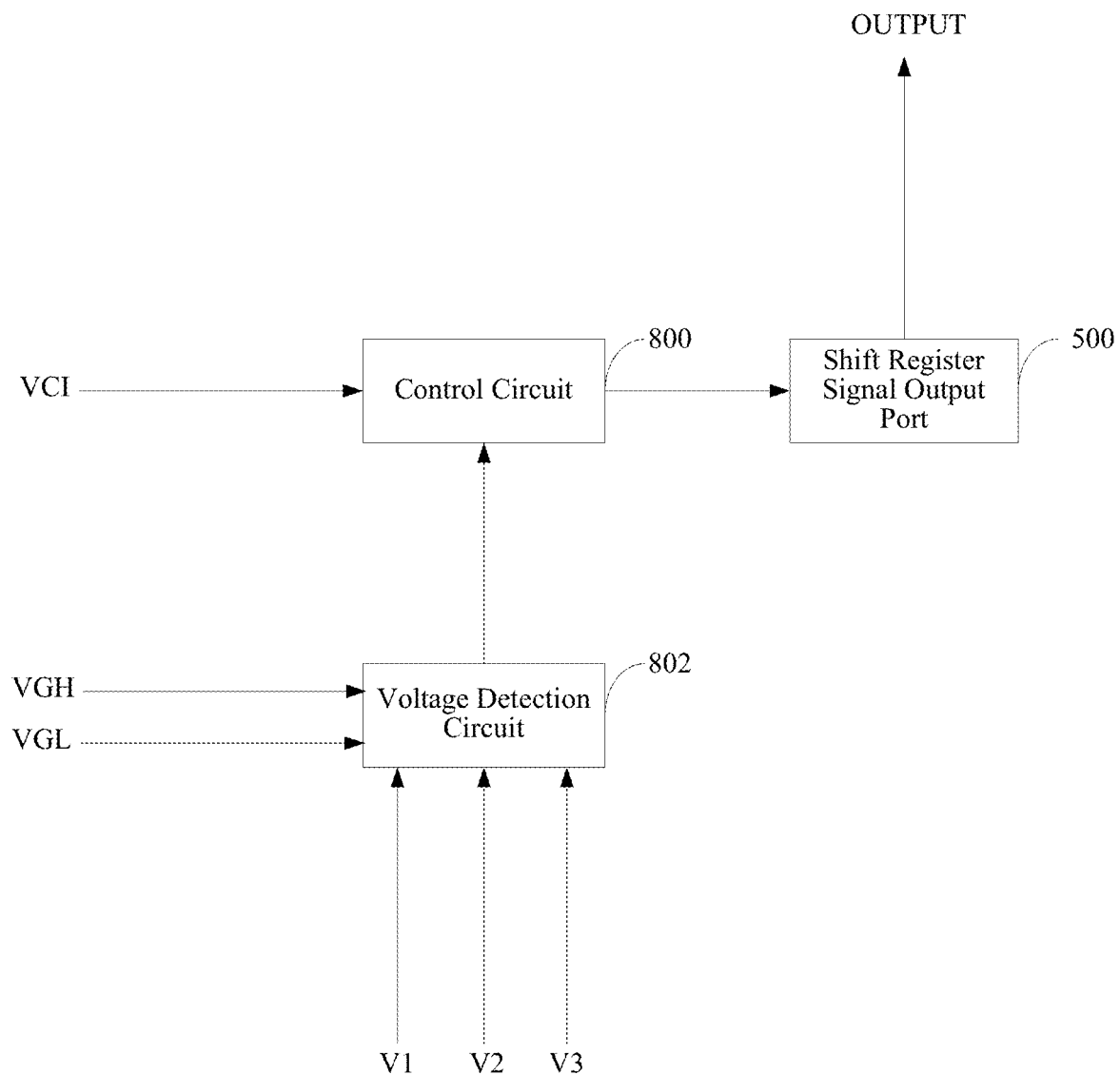
FIG. 10 is a structural schematic diagram of a display driving circuit provided by some exemplary embodiments.

FIG. 10 is a structural schematic diagram of a display driving circuit provided by some exemplary embodiments. As shown in FIG. 10, the display driving circuit 2000 includes a first input terminal, a second input terminal, a third input terminal, an output terminal OUTPUT and a shift register signal output port 500 as the above mentioned, and further includes a voltage detection circuit 802 and a control circuit 800.

As the above mentioned, the first input terminal is configured to receive a first signal V1, the second input terminal is configured to receive a second signal V2, and the third input terminal is configured to receive a third signal V3. The signals V1, V2 and V3 generally are voltage signals. The output terminal OUTPUT is configured to output a gate driver control GIP signal, so as to drive the above mentioned GOA circuit. The shift register signal output port 500 is configured to output the gate driver control GIP signal to the output terminal, which is the same as mentioned in the above exemplary embodiments.

Here, the voltage detection circuit 802 is configured to detect an anomaly of the first signal, the second signal, the third signal, and a high-voltage reference voltage signal VGH and a low-voltage reference voltage signal VGL in the display driving circuit 2000, and produce a detection result to indicate the anomaly.

Here, the control circuit 800 is configured to receive the detection result, wherein, when no anomaly is indicated by the detection result, the control circuit 800 controls the shift register signal output port 500 to output the gate driver control GIP signal, and when the anomaly of at least one of the first signal, the second signal, the third signal, and the high-voltage reference voltage signal VGH or the low-voltage reference voltage signal VGL in the display driving circuit 2000 is indicated by the detection result, the control circuit 800 controls the shift register signal output port 500 to stop outputting the gate driver control GIP signal.

Figure 11:
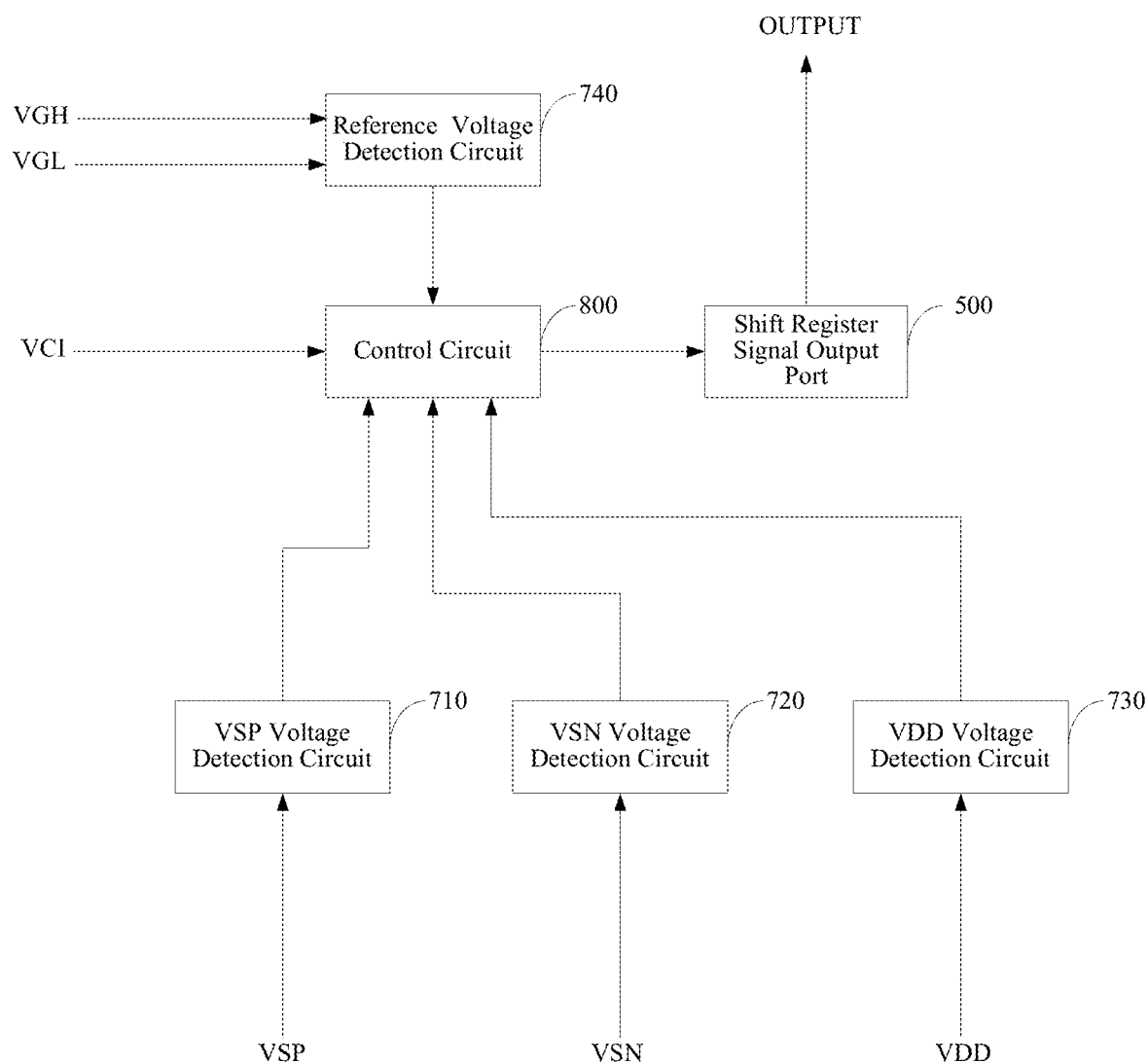
FIG. 11 is another structural schematic diagram of the display driving circuit provided by some exemplary embodiments.

FIG. 11 is another structural schematic diagram of the display driving circuit provided by some exemplary embodiments. As shown in FIG. 11, in the display driving circuit 2010, the first signal V1, the second signal V2 and the third signal V3 may be respectively a positive power supply VSP signal, a negative power supply VSN signal and a unipolar power supply VDD signal as the above mentioned. Here, the voltage detection circuit 802 may include the VSP voltage detection circuit 710, configured to detect an anomaly of the positive power supply VSP signal, and produce a VSP detection result to indicate the anomaly; the VSN voltage detection circuit 720, configured to detect an anomaly of the negative power supply VSN signal, and produce a VSN detection result to indicate the anomaly; and the VDD voltage detection circuit 730, configured to detect an anomaly of the unipolar power supply VDD signal, and produce a VDD detection result to indicate the anomaly, as was previously described herein.

Here, the voltage detection circuit 802 further includes a reference voltage detection circuit 740, configured to detect the anomaly of any one of the high-voltage reference voltage signal VGH and the low-voltage reference voltage signal VGL in the display driving circuit, and produce at least one of a VGH detection result or a VGL detection result to indicate the anomaly.

Here, the control circuit 800 is configured to receive the VSP detection result, the VSN detection result, the VDD detection result, the VGH detection result and the VGL detection result, wherein, when no anomaly is indicated by the VSP detection result, the VSN detection result, the VDD detection result, the VGH detection result and the VGL detection result, the control circuit 800 controls the shift register signal output port 500 to output the gate driver control GIP signal, and when the anomaly is indicated by at least one of the VSP detection result, the VSN detection result, the VDD detection result, the VGH detection result or the VGL detection result, the control circuit 800 controls the shift register signal output port 500 to stop outputting the gate driver control GIP signal.

Figure 12:
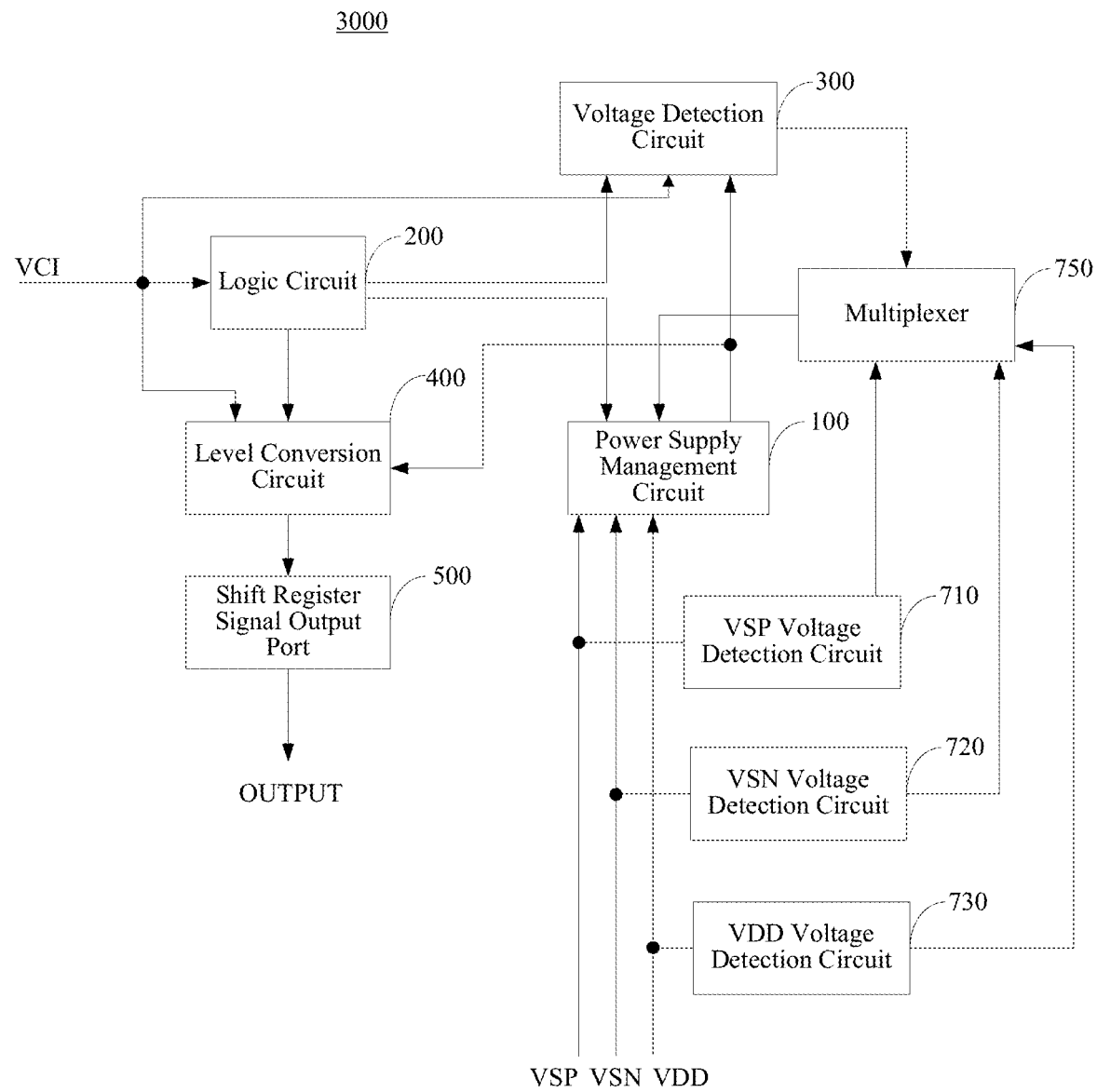
FIG. 12 is a structural schematic diagram of a display driving circuit provided by some exemplary embodiments.

FIG. 12 is a structural schematic diagram of a display driving circuit provided by some embodiments of the present disclosure. As shown in FIG. 12, in the display driving circuit 3000, the control circuit 800 includes a power supply management circuit 100 and a logic circuit 200 as the above mentioned, and further includes a multiplexer 750. Here the multiplexer 750 may be any devices has a "or" function, such that it can output any one of the signals input to it.

In FIG. 12, a first output terminal of the logic circuit 200 is coupled to a first input terminal of the power supply management circuit 100, and a second output terminal of the logic circuit 200 is coupled to a first input terminal of the reference voltage detection circuit, that is, the voltage detection circuit 300 as the above mentioned, an output terminal of the power supply management circuit 100 is coupled to a second input terminal of the reference voltage detection circuit, an output terminal of the reference voltage detection circuit is coupled to a first input terminal of the multiplexer 750, an output terminal of the VSP voltage detection circuit 710 is coupled to a second input terminal of the multiplexer 750, an output terminal of the VSN voltage detection circuit 720 is coupled to a third input terminal of the multiplexer 750, an output terminal of the VDD voltage detection circuit 730 is coupled to a fourth input terminal of the multiplexer 750, and an output terminal of the multiplexer 750 is coupled to a second input terminal of the power supply management circuit 100.

Here, the logic circuit 200 is configured to output a standard reference voltage signal to the reference voltage detection circuit, and to output a control signal to the power supply management circuit 100, the control signal is configured to control the power supply management circuit 100 to output a reference voltage signal including at least one of the high-voltage reference voltage signal VGH and the low-voltage reference voltage signal VGL, as was previously described herein.

The reference voltage detection circuit is further configured to produce at least one of the VGH detection result or the VGL detection result to indicate the anomaly, upon determining that the received reference voltage signal output by the power supply management circuit 100 is abnormal according to the standard reference voltage signal output by the logic circuit, and send at least one of the VGH detection result or the VGL detection result to the first input terminal of the multiplexer 750.

Further, the VSP voltage detection circuit 710 is further configured to send the VSP detection result to the second input terminal of the multiplexer, the VSN voltage detection circuit 720 is further configured to send the VSN detection result to the third input terminal of the multiplexer, and the VDD voltage detection circuit 730 is further configured to send the VDD detection result to the fourth input terminal of the multiplexer.

The multiplexer is configured to send a detect controlling signal according to the VSP detection result, the VSN detection result, the VDD detection result, the VGH detection result and the VGL detection result to the power supply management circuit 10. Then, when no anomaly is indicated by the VSP detection result, the VSN detection result, the VDD detection result, the VGH detection result and the VGL detection result, the power supply management circuit 100 outputs the reference voltage signal, and when the anomaly is indicated by at least one of the VSP detection result, the VSN detection result, the VDD detection result, the VGH detection result or the VGL detection result, the multiplexer controls the power supply management circuit 100 to stop outputting the reference voltage signal, such that the display driving circuit 3000 does not output the gate driver control GIP signal, so as to keep the display being black or white.

Figure 13:
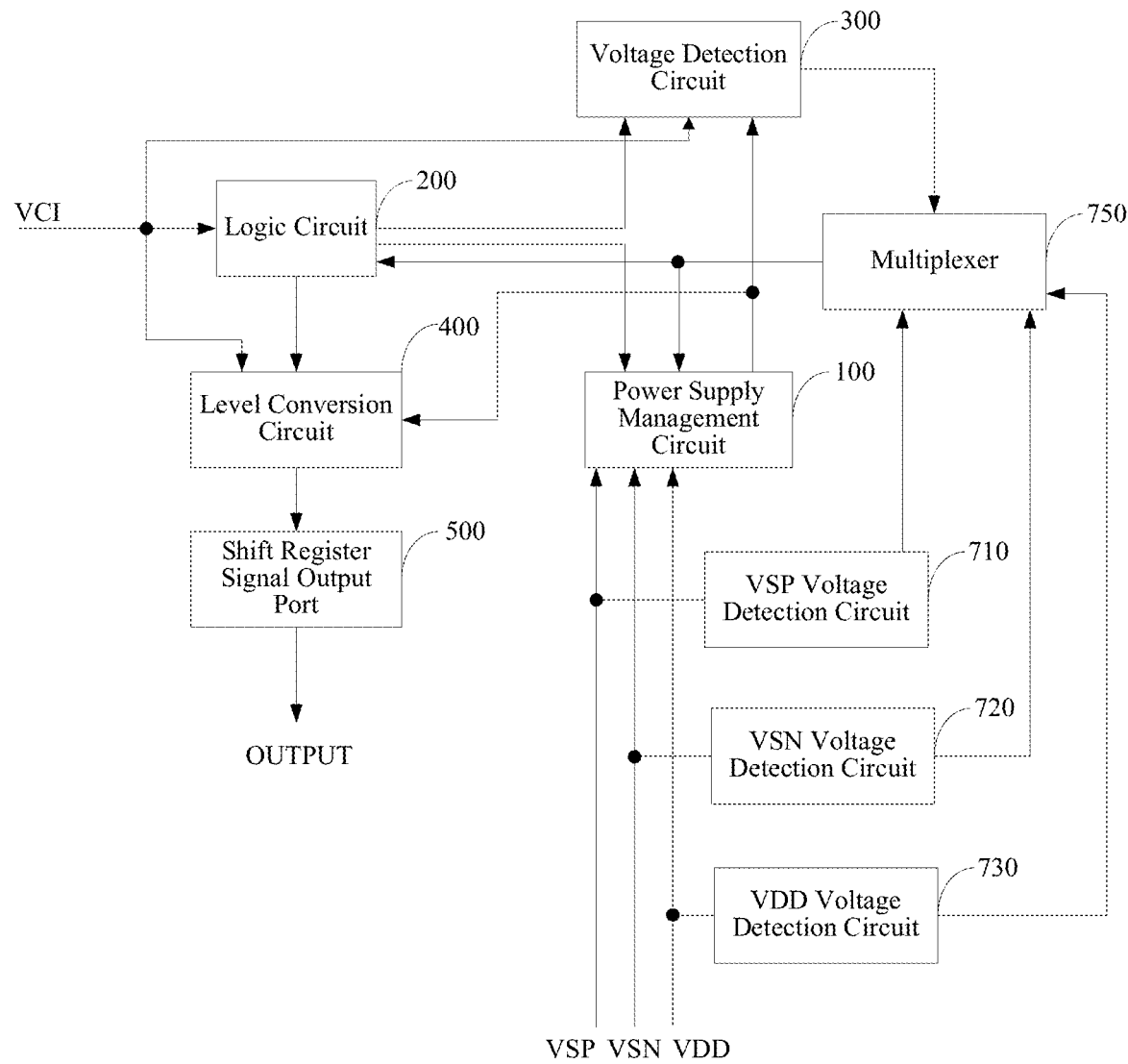
FIG. 13 is another structural schematic diagram of the display driving circuit provided by some exemplary embodiments.

FIG. 13 is another structural schematic diagram of the display driving circuit provided by some exemplary embodiments. As shown in FIG. 13, in the display driving circuit 3010, the output terminal of the multiplexer 750 is further coupled to a first input terminal of the logic circuit 200, so as to send a detect controlling signal according to the VSP detection result, the VSN detection result, the VDD detection result, the VGH detection result and the VGL detection result to the logic circuit 200 beside to the power supply management circuit 100.

Correspondingly, the logic circuit 200 is further configured to stop outputting the control signal, when the anomaly is indicated by at least one of the VSP detection result, the VSN detection result, the VDD detection result, the VGH detection result or the VGL detection result, so as to further ensure that the display driving circuit 3010 does not output the gate driver control GIP signal, but keeps the display being black or white.

In the display driving circuit of the disclosure, the control circuit 200 may further include a level conversion circuit 400. A first input terminal of the level conversion circuit 400 is coupled to the output terminal of the power supply management circuit 100, a second input terminal of the level conversion circuit 400 is coupled to a third output terminal of the logic circuit 200, and an output terminal of the level conversion circuit 400 is coupled to the shift register signal output port 500, the level conversion circuit 500 is configured to generate and output the gate driver control GIP signal according to a power supply signal sent from the logic circuit 200 and the reference voltage signal sent from the power supply management circuit 100, as was previously described herein.

Figure 14:
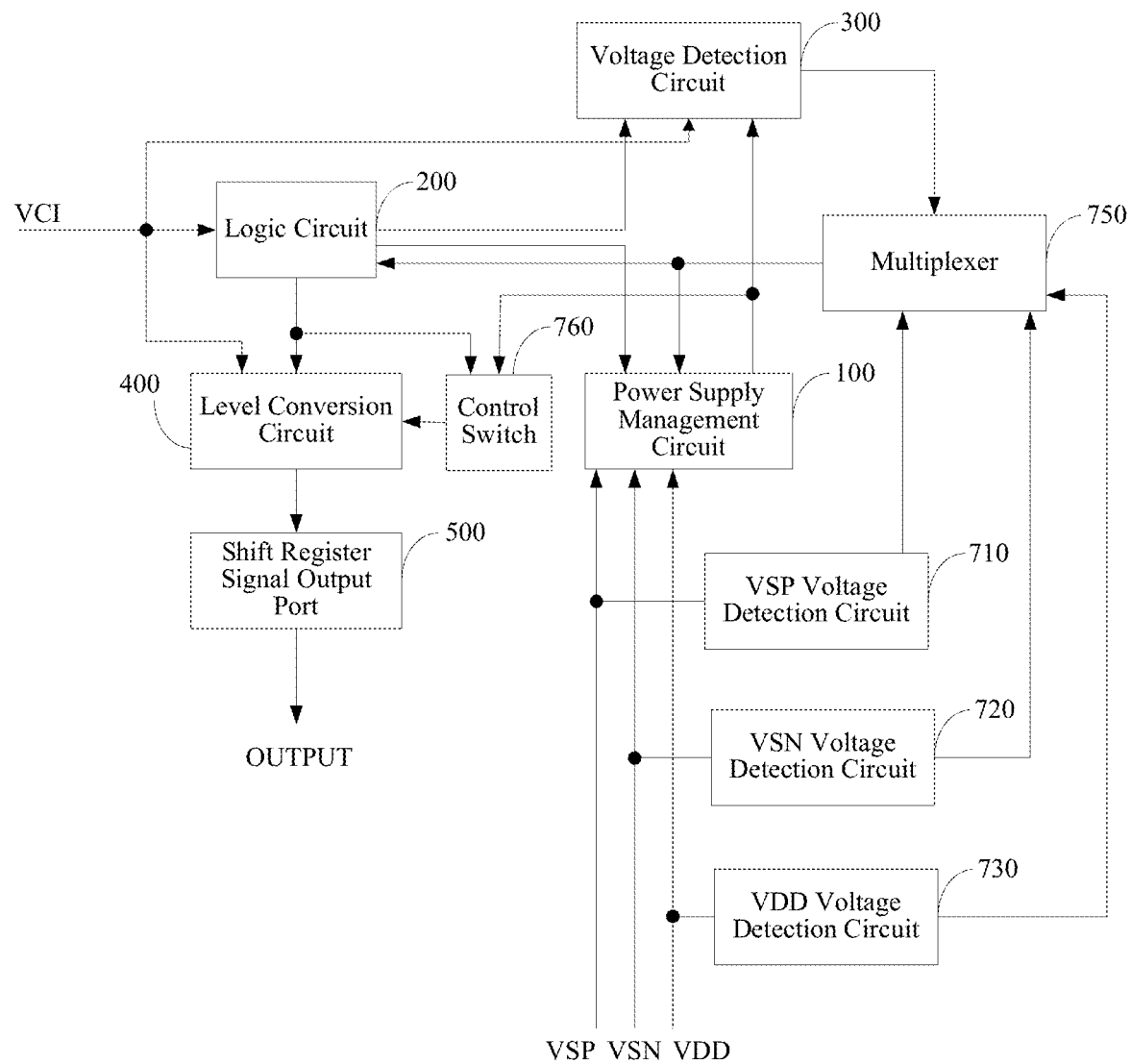
FIG. 14 is a structural schematic diagram of a display driving circuit provided by some exemplary embodiments.

FIG. 14 is a structural schematic diagram of a display driving circuit provided by some exemplary embodiments. As shown in FIG. 14, in the display driving circuit 3020, the control circuit 800 further includes a control switch 760, coupled between the first input terminal of the level conversion circuit 400 and the output terminal of the power supply management circuit 100, and configured to receive the control signal sent from the logic circuit 200, so as to be turned on or turned off under a control of the control signal output from the logic circuit 200 to provide or block a connection between the first input terminal of the level conversion circuit 400 and the output terminal of the power supply management circuit 100. This arrangement can thoroughly prevent the power supply management circuit 100 output error reference voltage to the level conversion circuit 400.

Figure 15:
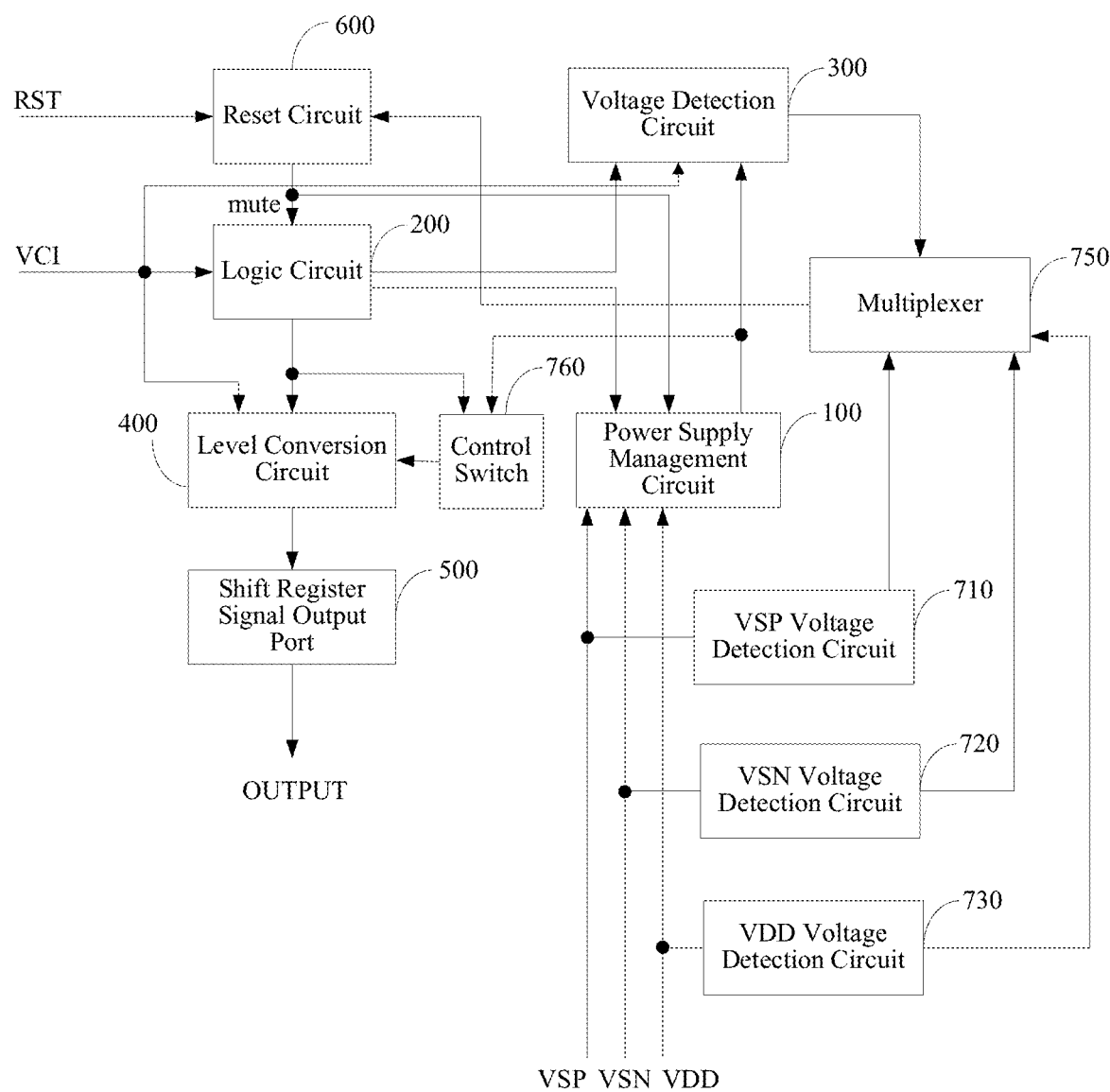
FIG. 15 is a structural schematic diagram of a display driving circuit provided by some exemplary embodiments.

FIG. 15 is a structural schematic diagram of a display driving circuit provided by some exemplary embodiments. As shown in FIG. 15, the display driving circuit 3030 further includes a reset circuit 600.

Here, the output terminal of the multiplexer 750 is coupled to the second input terminal of the power supply management circuit 100 and the first input terminal of the logic circuit 200 respectively through the reset circuit 600.

The reference voltage detection circuit, that is, the voltage detection circuit 300, is configured to send a warning signal, upon determining that the received reference voltage signal output by the power supply management circuit 100 is abnormal according to the standard reference voltage signal output by the logic circuit 200, as was previously described herein.

Here, the reset circuit 600 is configured to send a standby signal (mute) to the power supply management circuit 100 and the logic circuit 200 respectively, so as to control the power supply management circuit 100 and the logic circuit 200 to be in a standby state respectively upon receiving the warning signal.

In another view, the display driving circuits of the disclosure can be looked as including a timer control register (TCON) and a gate driver circuit. Here, the time controller includes the logic circuit, and the gate driver circuit includes the above mentioned VSP voltage detection circuit, VSN voltage detection circuit, VDD voltage detection circuit, reference voltage detection circuit, shift register signal output port, power supply management circuit, multiplexer, level conversion circuit, control switch and the reset circuit.

Further, the display driving circuits of the disclosure can further include a source driver circuit.

As another exemplary embodiment, all of the circuits of the display driving circuit of the disclosure, including the voltage detection circuit 802 and the control circuit 800 are integrated in one chip.

Figure 16:
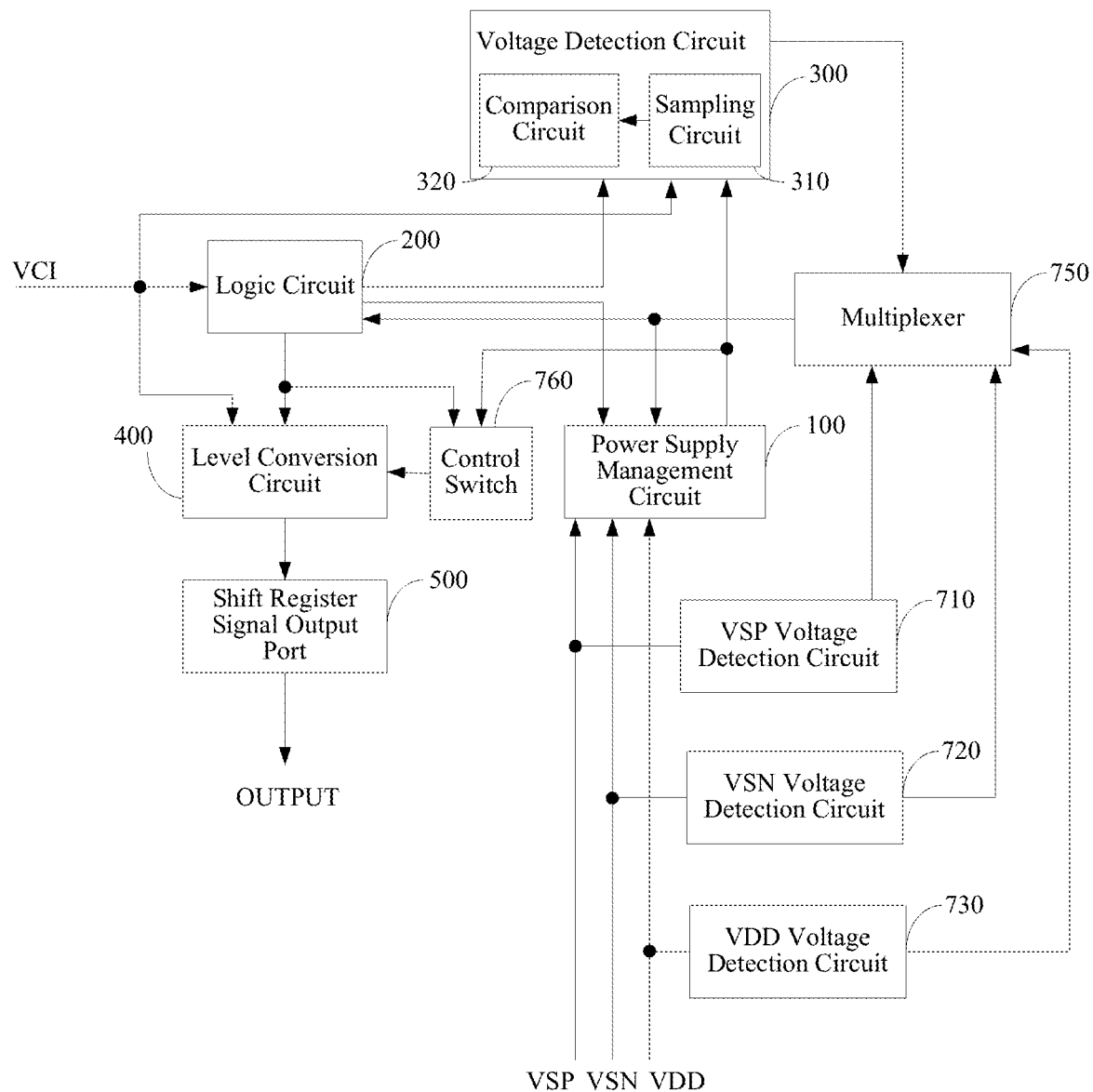
FIG. 16 is a structural schematic diagram of a display driving circuit provided by some exemplary embodiments.

FIG. 16 is a structural schematic diagram of a display driving circuit provided by some exemplary embodiments. As shown in FIG. 16, in the display driving circuit 3040, the reference voltage detection circuit, that is, the voltage detection circuit 300, as the above mentioned, may include a sampling circuit 310 coupled to the output terminal of the power supply management circuit 100 and a comparison circuit 320 coupled to the logic circuit 200. The sampling circuit 310 is configured to convert the reference voltage signal into a digital signal and to output the digital signal to the comparison circuit 320, upon receiving the reference voltage signal. The comparison circuit 320 is configured to compare the digital signal with the standard reference voltage signal as received, and to send the warning signal, upon determining that a difference between the digital signal and the standard reference voltage signal is not within a threshold range. Here, the warning signal is really sent to the multiplexer 750 firstly.

As another exemplary embodiment, the comparison circuit 320 is configured to compare the digital signal with the standard reference voltage signal as received, and to send a standby signal, to control the power supply management circuit 100 and the logic circuit 200 to be in a standby state respectively upon determining that a difference between the digital signal and the standard reference voltage signal is not within a threshold range. Here, the standby signal is really sent to the multiplexer 750 firstly.

Figure 17:
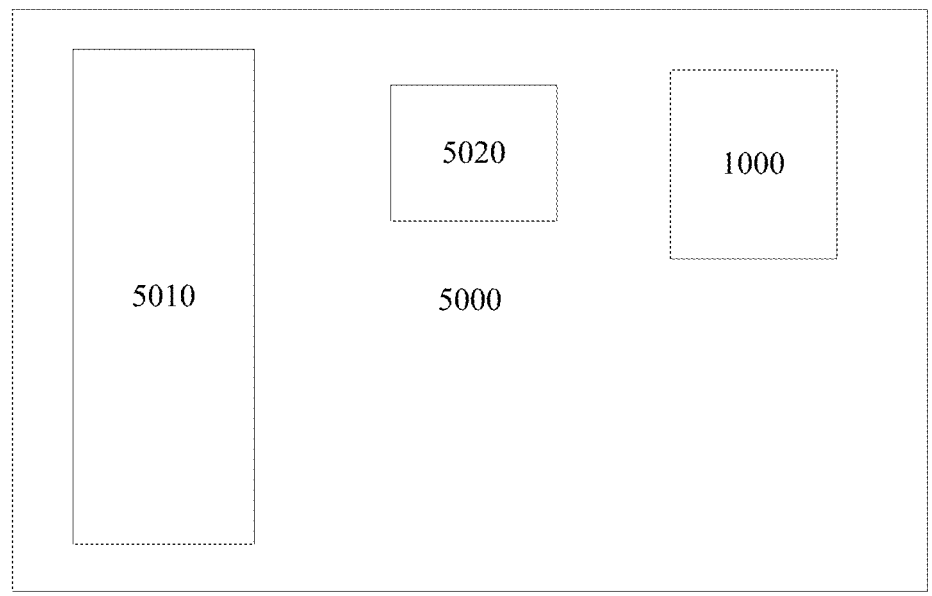
FIG. 17 is a structural schematic diagram of the display device provided by some exemplary embodiments.

FIG. 17 is a structural schematic diagram of the display device provided by some exemplary embodiments. As shown in FIG. 17, the display device 5000 includes a display panel 5010 integrated with a shift register 5020 and the display driving circuit of the disclosure such as the above mentioned display driving circuit 1000.

Figure 18:
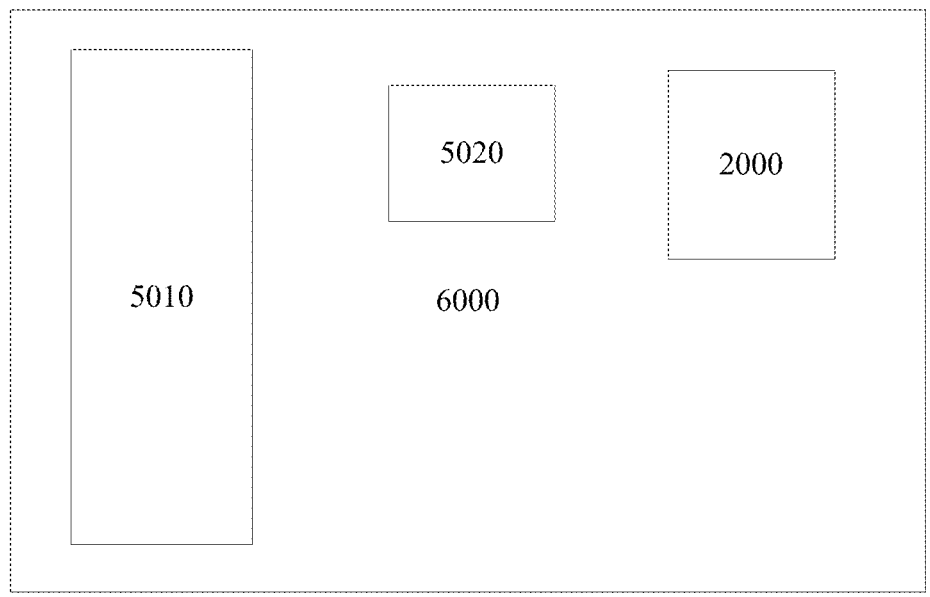
FIG. 18 is a structural schematic diagram of a display device provided by some exemplary embodiments.

FIG. 18 is a structural schematic diagram of a display device provided by some embodiments of the present disclosure. As shown in FIG. 18, the display device 6000 includes a display panel 5010 integrated with a shift register 5020 and the display driving circuit of the disclosure such as the above mentioned display driving circuit 2000.

Figure 19:
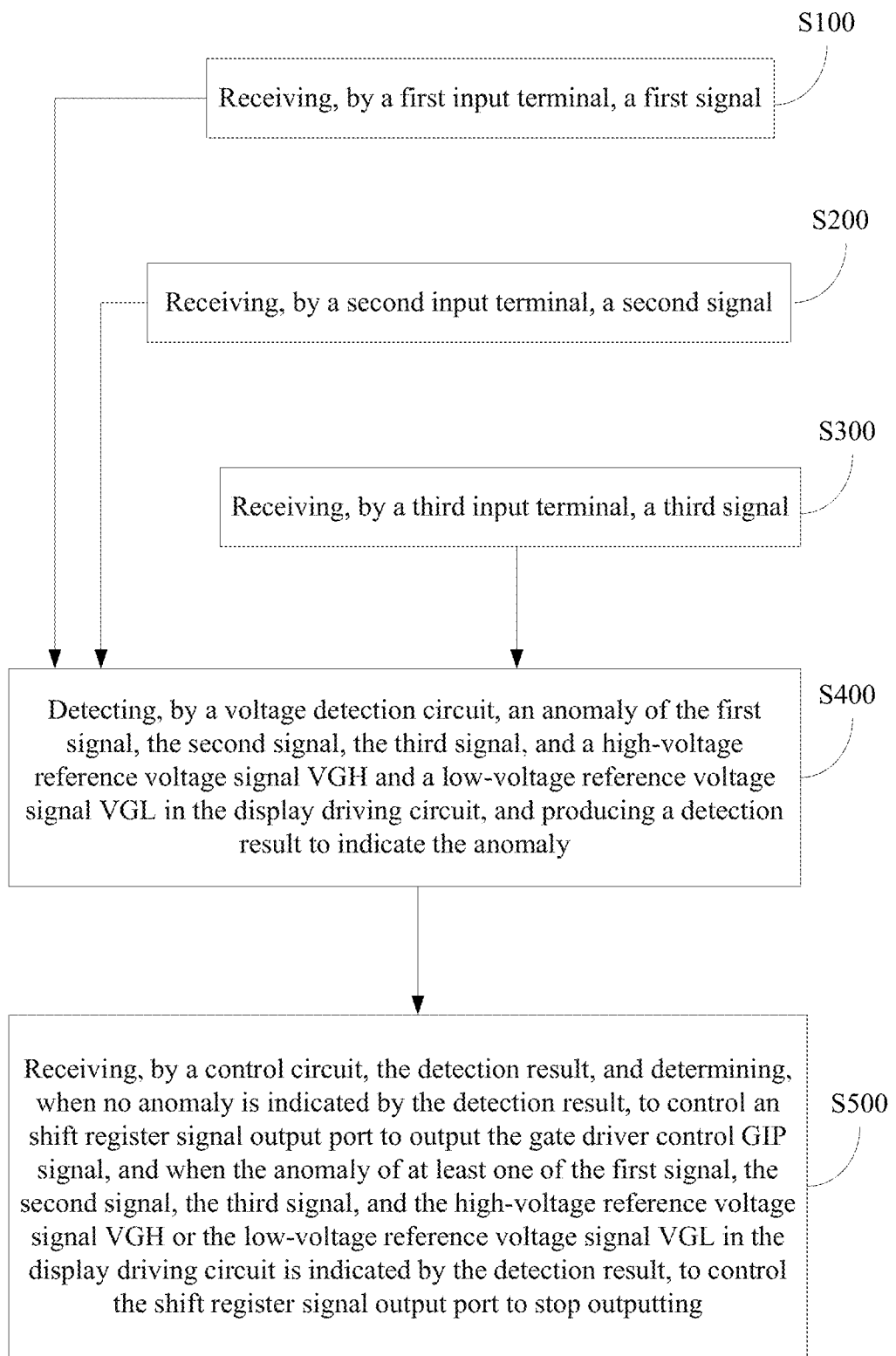
FIG. 19 is a flow chart of a driving method provided by some exemplary embodiments.

FIG. 19 is a flow chart of a driving method provided by some exemplary embodiments. As shown in FIG. 19, the driving method is applied on the display driving circuit of the disclosure such as the above mentioned display driving circuit 2000, and includes the following steps:

Step S100, receiving, by a first input terminal, a first signal;

Step S200, receiving, by a second input terminal, a second signal;

Step S300, receiving, by a third input terminal, a third signal;

Step S400, detecting, by a voltage detection circuit, an anomaly of the first signal, the second signal, the third signal, and a high-voltage reference voltage signal VGH and a low-voltage reference voltage signal VGL in the display driving circuit, and producing a detection result to indicate the anomaly; and Step S500, receiving, by a control circuit, the detection result, and determining, when no anomaly is indicated by the detection result, to control an shift register signal output port to output the gate driver control GIP signal, and when the anomaly of at least one of the first signal, the second signal, the third signal, and the high-voltage reference voltage signal VGH or the low-voltage reference voltage signal VGL in the display driving circuit is indicated by the detection result, to control the shift register signal output port to stop outputting.

Since the drive method substantively has been described in the above description of the exemplary embodiments of the display driving circuits of the disclosure, it will not be repeatedly described here.

Further, as an exemplary embodiment, in the driving method of the disclosure, the first signal may be the positive power supply VSP signal, the second signal may be the negative power supply VSN signal, and the third signal may be the unipolar power supply VDD signal, the voltage detection circuit may include: the VSP voltage detection circuit, configured to detect the anomaly of the positive power supply VSP signal, and produce a VSP detection result to indicate the anomaly; the VSN voltage detection circuit, configured to detect the anomaly of the negative power supply VSN signal, and produce a VSN detection result to indicate the anomaly; the VDD voltage detection circuit, configured to detect the anomaly of the unipolar power supply VDD signal, and produce a VDD detection result to indicate the anomaly; and the reference voltage detection circuit, configured to detect the anomaly of any one of the high-voltage reference voltage signal VGH and the low-voltage reference voltage signal VGL in the display driving circuit, and produce at least one of a VGH detection result or a VGL detection result to indicate the anomaly, and the control circuit may be further configured to receive the VSP detection result, the VSN detection result, the VDD detection result, the VGH detection result and the VGL detection result, wherein, when no anomaly is indicated by the VSP detection result, the VSN detection result, the VDD detection result, the VGH detection result and the VGL detection result, the control circuit controls the shift register signal output port to output the gate driver control GIP signal, and when the anomaly is indicated by at least one of the VSP detection result, the VSN detection result, the VDD detection result, the VGH detection result or the VGL detection result, the control circuit controls the shift register signal output port to stop outputting, as the above mentioned.

Further, as an exemplary embodiment, in the driving method of the disclosure, the control circuit may include the power supply management circuit, the logic circuit and the multiplexer, a first output terminal of the logic circuit is coupled to a first input terminal of the power supply management circuit, and a second output terminal of the logic circuit is coupled to a first input terminal of the reference voltage detection circuit, an output terminal of the power supply management circuit is coupled to a second input terminal of the reference voltage detection circuit, an output terminal of the reference voltage detection circuit is coupled to a first input terminal of the multiplexer, an output terminal of the VSP voltage detection circuit is coupled to a second input terminal of the multiplexer, an output terminal of the VSN voltage detection circuit is coupled to a third input terminal of the multiplexer, an output terminal of the VDD voltage detection circuit is coupled to a fourth input terminal of the multiplexer, and an output terminal of the multiplexer is coupled to a second input terminal of the power supply management circuit, the logic circuit may be configured to output a standard reference voltage signal to the reference voltage detection circuit, and to output a control signal to the power supply management circuit, the control signal is configured to control the power supply management circuit to output a reference voltage signal including at least one of the high-voltage reference voltage signal VGH and the low-voltage reference voltage signal VGL, the reference voltage detection circuit may be further configured to produce at least one of the VGH detection result or the VGL detection result to indicate the anomaly, upon determining that the received reference voltage signal output by the power supply management circuit is abnormal according to the standard reference voltage signal output by the logic circuit, and send at least one of the VGH detection result or the VGL detection result to the first input terminal of the multiplexer, the VSP voltage detection circuit may be further configured to send the VSP detection result to the second input terminal of the multiplexer, the VSN voltage detection circuit may be further configured to send the VSN detection result to the third input terminal of the multiplexer, the VDD voltage detection circuit may be further configured to send the VDD detection result to the fourth input terminal of the multiplexer, the multiplexer may be configured to send a detect controlling signal according to the VSP detection result, the VSN detection result, the VDD detection result, the VGH detection result and the VGL detection result to the power supply management circuit, and when no anomaly is indicated by the VSP detection result, the VSN detection result, the VDD detection result, the VGH detection result and the VGL detection result, the power supply management circuit outputs the reference voltage signal, and when the anomaly is indicated by at least one of the VSP detection result, the VSN detection result, the VDD detection result, the VGH detection result or the VGL detection result, the multiplexer controls the power supply management circuit to stop outputting the reference voltage signal.

Exemplary embodiments provide a display driving circuit, a driving method thereof and a display device which additionally incorporate three external voltage detections circuit besides a voltage detection circuit into an existing display driving circuit and provide a control switch between the first input terminal of the level conversion circuit and the output terminal of the power supply management circuit, such that it can detect and prevent anomaly more thoroughly and accurately, therefore upon determining that the signal is abnormal, it can bring the display panel in a normally white mode or a normally black mode, which avoids a possible scenario that a gate driver control signal mismatched with a voltage required by a shift register of the display panel is input into the shift register, and hence prevents assembled display products from involving any anomaly due to the mismatch of the output signal of the display driving circuit and the display panel.

Obviously, those skilled in the art can make various modifications and variations to the present invention without departing from the spirit and scope of the present invention. In this way, if these modifications and variations of the present invention fall within the scope of the claims of the present invention and the equivalents, the present invention is also intended to include these modifications and variations.

What is claimed is:

1. A display driving circuit, comprising:
a first input terminal, configured to receive a first signal;
a second input terminal, configured to receive a second signal;
a third input terminal, configured to receive a third signal;
an output terminal, configured to output a gate driver control GIP signal;

a voltage detection circuit, configured to detect an anomaly of the first signal, the second signal and the third signal, and produce a detection result to indicate the anomaly;

a shift register signal output port, configured to output the gate driver control GIP signal to the output terminal; and a control circuit, configured to receive the detection result, wherein, when no anomaly is indicated by the detection result; the control circuit controls the shift register signal output port to output the gate driver control GIP signal, and when the anomaly of at least one of the first signal, the second signal or the third signal is indicated by the detection result, the control circuit controls the shift register signal output port to stop outputting, wherein the first signal is a positive power supply VSP signal,
the second signal is a negative power supply VSN signal,
the third signal is a unipolar power supply VDD signal,
the voltage detection circuit comprises:

a VSP voltage detection circuit, configured to detect an anomaly of the positive power supply VSP signal, and produce a VSP detection result to indicate the anomaly;

a VSN voltage detection circuit, configured to detect an anomaly of the negative power supply VSN signal, and produce a VSN detection result to indicate the anomaly; and a VDD voltage detection circuit, configured to detect an anomaly of the unipolar power supply VDD signal, and produce a VDD detection result to indicate the anomaly;

the control circuit is further configured to receive the VSP detection result, the VSN detection result and the VDD detection result, and when no anomaly is indicated by the VSP detection result, the VSN detection result and the VDD detection result, the control circuit controls the shift register signal output port to output the gate driver control GIP signal, and when the anomaly is indicated by at least one of the VSP detection result, the VSN detection result or the VDD detection result, the control circuit controls the shift register signal output port to stop outputting.

2. The display driving circuit according to claim 1, wherein the voltage detection circuit and the control circuit are integrated in one chip.

3. A display driving circuit, comprising:
a first input terminal, configured to receive a first signal;
a second input terminal, configured to receive a second signal;
a third input terminal, configured to receive a third signal;
an output terminal, configured to output a gate driver control GIP signal;
a voltage detection circuit, configured to detect an anomaly of the first signal, the second signal, the third signal, and a high-voltage reference voltage signal VGH and a low-voltage reference voltage signal VGL in the display driving circuit, and produce a detection result to indicate the anomaly;

a shift register signal output port, configured to output the gate driver control GIP signal to the output terminal; and a control circuit, configured to receive the detection result, wherein, when no anomaly is indicated by the detection result, the control circuit controls the shift register signal output port to output the gate driver control GIP signal, and when the anomaly of at least one of the first signal, the second signal, the third signal, and the high-voltage reference voltage signal VGH or the low-voltage reference voltage signal VGL in the display driving circuit is indicated by the detection result, the control circuit controls the shift register signal output port to stop outputting, wherein the first signal is a positive power supply VSP signal,
the second signal is a negative power supply VSN signal,
the third signal is a unipolar power supply VDD signal,
the voltage detection circuit comprises:

a VSP voltage detection circuit, configured to detect the anomaly of the positive power supply VSP signal, and produce a VSP detection result to indicate the anomaly;

a VSN voltage detection circuit, configured to detect the anomaly of the negative power supply VSN signal, and produce a VSN detection result to indicate the anomaly;

a VDD voltage detection circuit, configured to detect the anomaly of the unipolar power supply VDD signal, and produce a VDD detection result to indicate the anomaly; and a reference voltage detection circuit, configured to detect the anomaly of any one of the high-voltage reference voltage signal VGH and the low-voltage reference voltage signal VGL in the display driving circuit, and produce at least one of a VGH detection result or a VGL detection result to indicate the anomaly, and the control circuit is further configured to receive the VSP detection result, the VSN detection result, the VDD detection result, the VGH detection result and the VGL detection result, wherein, when no anomaly is indicated by the VSP detection result, the VSN detection result, the VDD detection result, the VGH detection result and the VGL detection result, the control circuit controls the shift register signal output port to output the gate driver control GIP signal, and when the anomaly is indicated by at least one of the VSP detection result, the VSN detection result, the VDD detection result, the VGH detection result or the VGL detection result, the control circuit controls the shift register signal output port to stop outputting.

4. The display driving circuit according to claim 3, wherein the control circuit comprises a power supply management circuit, a logic circuit and a multiplexer, a first output terminal of the logic circuit is coupled to a first input terminal of the power supply management circuit, and a second output terminal of the logic circuit is coupled to a first input terminal of the reference voltage detection circuit, an output terminal of the power supply management circuit is coupled to a second input terminal of the reference voltage detection circuit, an output terminal of the reference voltage detection circuit is coupled to a first input terminal of the multiplexer, an output terminal of the VSP voltage detection circuit is coupled to a second input terminal of the multiplexer, an output terminal of the VSN voltage detection circuit is coupled to a third input terminal of the multiplexer, an output terminal of the VDD voltage detection circuit is coupled to a fourth input terminal of the multiplexer, and an output terminal of the multiplexer is coupled to a second input terminal of the power supply management circuit, the logic circuit is configured to output a standard reference voltage signal to the reference voltage detection circuit, and to output a control signal to the power supply management circuit, the control signal is configured to control the power supply management circuit to output a reference voltage signal comprising at least one of the high-voltage reference voltage signal VGH and the low-voltage reference voltage signal VGL, the reference voltage detection circuit is further configured to produce at least one of the VGH detection result or the VGL detection result to indicate the anomaly, upon determining that the received reference voltage signal output by the power supply management circuit is abnormal according to the standard reference voltage signal output by the logic circuit, and send at least one of the VGH detection result or the VGL detection result to the first input terminal of the multiplexer, the VSP voltage detection circuit is further configured to send the VSP detection result to the second input terminal of the multiplexer, the VSN voltage detection circuit is further configured to send the VSN detection result to the third input terminal of the multiplexer, the VDD voltage detection circuit is further configured to send the VDD detection result to the fourth input terminal of the multiplexer, the multiplexer is configured to send a detect controlling signal according to the VSP detection result, the VSN detection result, the VDD detection result, the VGH detection result and the VGL detection result to the power supply management circuit, and when no anomaly is indicated by the VSP detection result, the VSN detection result, the VDD detection result, the VGH detection result and the VGL detection result, the power supply management circuit outputs the reference voltage signal, and when the anomaly is indicated by at least one of the VSP detection result, the VSN detection result, the VDD detection result, the VGH detection result or the VGL detection result, the multiplexer controls the power supply management circuit to stop outputting the reference voltage signal.

5. The display driving circuit according to claim 4, wherein the output terminal of the multiplexer is further coupled to a first input terminal of the logic circuit, to send the VSP detection result, the VSN detection result, the VDD detection result, the VGH detection result and the VGL detection result to the logic circuit, and the logic circuit is further configured to stop outputting the control signal, when the anomaly is indicated by at least one of the VSP detection result, the VSN detection result, the VDD detection result, the VGH detection result or the VGL detection result.

6. The display driving circuit according to claim 4, wherein the control circuit further comprises a level conversion circuit, a first input terminal of the level conversion circuit is coupled to the output terminal of the power supply management circuit, a second input terminal of the level conversion circuit is coupled to a third output terminal of the logic circuit, and an output terminal of the level conversion circuit is coupled to the shift register signal output port, and the level conversion circuit is configured to generate and output the gate driver control GIP signal according to a power supply signal sent from the logic circuit and the reference voltage signal sent from the power supply management circuit.

7. The display driving circuit according to claim 6, wherein the control circuit further comprises:

a control switch, coupled between the first input terminal of the level conversion circuit and the output terminal of the power supply management circuit, and configured to receive the control signal sent from the logic circuit, so as to be turned on or turned off under a control of the control signal sent from the logic circuit to provide or block a connection between the first input terminal of the level conversion circuit and the output terminal of the power supply management circuit.

8. The display driving circuit according to claim 7, further comprising a reset circuit, wherein the output terminal of the multiplexer is coupled to the second input terminal of the power supply management circuit and the first input terminal of the logic circuit, respectively, through the reset circuit, the reference voltage detection circuit is configured to send a warning signal, upon determining that the received reference voltage signal output by the power supply management circuit is abnormal according to the standard reference voltage signal output by the logic circuit, and the reset circuit is configured to send a standby signal to the power supply management circuit and the logic circuit, respectively, to control the power supply management circuit and the logic circuit to be in a standby state, respectively, upon receiving the warning signal.

9. The display driving circuit according to claim 8, comprising:

a time controller comprising the logic circuit; and a gate driver circuit comprising the VSP voltage detection circuit, the VSN voltage detection circuit, the VDD voltage detection circuit, the reference voltage detection circuit, the shift register signal output port, the power supply management circuit, the multiplexer, the level conversion circuit, the control switch and the reset circuit.

10. The display driving circuit according to claim 9, further comprising a source driver circuit.

11. The display driving circuit according to claim 3, wherein the voltage detection circuit and the control circuit are integrated in one chip.

12. The display driving circuit according to claim 7, wherein the reference voltage detection circuit comprises a sampling circuit coupled to the output terminal of the power supply management circuit and a comparison circuit coupled to the logic circuit, the sampling circuit is configured to convert the reference voltage signal into a digital signal and to output the digital signal to the comparison circuit, upon receiving the reference voltage signal, and the comparison circuit is configured to compare the digital signal with the standard reference voltage signal as received, and to send the warning signal, upon determining that a difference between the digital signal and the standard reference voltage signal is not within a threshold range.

13. The display driving circuit according to claim 7, wherein the reference voltage detection circuit comprises a sampling circuit coupled to the output terminal of the power supply management circuit, and a comparison circuit coupled to the logic circuit, the sampling circuit is configured to convert the reference voltage signal into a digital signal and to output the digital signal to the comparison circuit, upon receiving the reference voltage signal, and the comparison circuit is configured to compare the digital signal with the standard reference voltage signal as received, and to send a standby signal, to control the power supply management circuit and the logic circuit to be in a standby state, respectively, upon determining that a difference between the digital signal and the standard reference voltage signal is not within a threshold range.

14. A display device, comprising: a display panel integrated with a shift register, and the display driving circuit according to claim 1.

15. A display device, comprising: a display panel integrated with a shift register, and the display driving circuit according to claim 3.

16. A driving method of the display driving circuit according to claim 3, comprising:

receiving, by a first input terminal, a first signal;
receiving, by a second input terminal, a second signal;
receiving, by a third input terminal, a third signal;
detecting, by a voltage detection circuit, an anomaly of the first signal, the second signal, the third signal, and a high-voltage reference voltage signal VGH and a low-voltage reference voltage signal VGL in the display driving circuit, and producing a detection result to indicate the anomaly;

receiving, by a control circuit, the detection result, and determining, when no anomaly is indicated by the detection result, to control an shift register signal output port to output the gate driver control GIP signal, and when the anomaly of at least one of the first signal, the second signal, the third signal, and the high-voltage reference voltage signal VGH or the low-voltage reference voltage signal VGL in the display driving circuit is indicated by the detection result, to control the shift register signal output port to stop outputting.

17. The driving method according to claim 16, wherein the control circuit comprises a power supply management circuit, a logic circuit and a multiplexer, a first output terminal of the logic circuit is coupled to a first input terminal of the power supply management circuit, and a second output terminal of the logic circuit is coupled to a first input terminal of the reference voltage detection circuit, an output terminal of the power supply management circuit is coupled to a second input terminal of the reference voltage detection circuit, an output terminal of the reference voltage detection circuit is coupled to a first input terminal of the multiplexer, an output terminal of the VSP voltage detection circuit is coupled to a second input terminal of the multiplexer, an output terminal of the VSN voltage detection circuit is coupled to a third input terminal of the multiplexer, an output terminal of the VDD voltage detection circuit is coupled to a fourth input terminal of the multiplexer, and an output terminal of the multiplexer is coupled to a second input terminal of the power supply management circuit, the logic circuit is configured to output a standard reference voltage signal to the reference voltage detection circuit, and to output a control signal to the power supply management circuit, the control signal is configured to control the power supply management circuit to output a reference voltage signal comprising at least one of the high-voltage reference voltage signal VGH and the low-voltage reference voltage signal VGL, the reference voltage detection circuit is further configured to produce at least one of the VGH detection result or the VGL detection result to indicate the anomaly, upon determining that the received reference voltage signal output by the power supply management circuit is abnormal according to the standard reference voltage signal output by the logic circuit, and send at least one of the VGH detection result or the VGL detection result to the first input terminal of the multiplexer, the VSP voltage detection circuit is further configured to send the VSP detection result to the second input terminal of the multiplexer, the VSN voltage detection circuit is further configured to send the VSN detection result to the third input terminal of the multiplexer, the VDD voltage detection circuit is further configured to send the VDD detection result to the fourth input terminal of the multiplexer, the multiplexer is configured to send a detect controlling signal according to the VSP detection result, the VSN detection result, the VDD detection result, the VGH detection result and the VGL detection result to the power supply management circuit, and when no anomaly is indicated by the VSP detection result, the VSN detection result, the VDD detection result, the VGH detection result and the VGL detection result, the power supply management circuit outputs the reference voltage signal, and when the anomaly is indicated by at least one of the VSP detection result, the VSN detection result, the VDD detection result, the VGH detection result or the VGL detection result, the multiplexer controls the power supply management circuit to stop outputting the reference voltage signal.

* * * * *